US009835694B2

(12) United States Patent
Coar et al.

(10) Patent No.: US 9,835,694 B2
(45) Date of Patent: Dec. 5, 2017

(54) HIGHER MAGNETIC SENSITIVITY THROUGH FLUORESCENCE MANIPULATION BY PHONON SPECTRUM CONTROL

(71) Applicant: Lockheed Martin Corporation, Bethesda, MD (US)

(72) Inventors: David N. Coar, Cherry Hill, NJ (US); Jeff D. Cammerata, Medford Lakes, NJ (US)

(73) Assignee: Lockheed Martin Corporation, Bethesda, MD (US)

( * ) Notice: Subject to any disclaimer, the term of this patent is extended or adjusted under 35 U.S.C. 154(b) by 0 days.

(21) Appl. No.: 15/204,675

(22) Filed: Jul. 7, 2016

(65) Prior Publication Data

US 2017/0212184 A1    Jul. 27, 2017

Related U.S. Application Data

(63) Continuation of application No. 15/003,256, filed on Jan. 21, 2016.

(51) Int. Cl.
*G01R 33/02* (2006.01)
*G01R 33/032* (2006.01)
(Continued)

(52) U.S. Cl.
CPC ............ *G01R 33/032* (2013.01); *G01H 1/00* (2013.01); *G01H 9/00* (2013.01)

(58) Field of Classification Search
CPC .. G01R 33/032; G01R 33/0094; G01R 15/24; G01R 19/00
(Continued)

(56) References Cited

U.S. PATENT DOCUMENTS 2,746,027 A    5/1956 Murray
3,359,812 A    12/1967 Everitt
(Continued)

FOREIGN PATENT DOCUMENTS

CN    105738845 A    7/2016
DE    69608006 T2    2/2001
(Continued)

OTHER PUBLICATIONS

"'Diamond Sensors, Detectors, and Quantum Devices' in Patent Application Approval Process," Chemicals & Chemistry, pp. 1-6, (Feb 28, 2014), 6 pages.
(Continued)

*Primary Examiner* — Giovanni Astacio-Oquendo
(74) *Attorney, Agent, or Firm* — Foley & Lardner LLP

(57) ABSTRACT

Methods and configuration are disclosed for providing higher magnetic sensitivity magnetometers through fluorescence manipulation by phonon spectrum control. A method for increasing the magnetic sensitivity for a DNV sensor may include providing a diamond having nitrogen vacancies of a DNV sensor and an acoustic driver and acoustically driving the diamond with the acoustic driver to manipulate a phonon spectrum of the DNV sensor. A DNV sensor may include a diamond having nitrogen vacancies, a photo detector configured to detect photon emissions from the diamond responsive to laser excitation of the diamond and an acoustic driver configured to manipulate a phonon spectrum for the DNV sensor by acoustically driving the diamond.

19 Claims, 4 Drawing Sheets

(51) Int. Cl.
 *G01H 1/00* (2006.01)
 *G01H 9/00* (2006.01)
(58) Field of Classification Search
 USPC .................................. 324/244.1, 200, 244
 See application file for complete search history.

(56) References Cited

U.S. PATENT DOCUMENTS

| | | | |
|---|---|---|---|
| 3,389,333 A | 6/1968 | Wolff et al. |
| 3,490,032 A | 1/1970 | Zurflueh |
| 3,514,723 A | 5/1970 | Cutler |
| 3,518,531 A | 6/1970 | Huggett |
| 3,745,452 A | 7/1973 | Osburn et al. |
| 3,899,758 A | 8/1975 | Maier et al. |
| 4,025,873 A | 5/1977 | Chilluffo |
| 4,078,247 A | 3/1978 | Albrecht |
| 4,084,215 A | 4/1978 | Willenbrock |
| 4,322,769 A | 3/1982 | Cooper |
| 4,329,173 A | 5/1982 | Culling |
| 4,359,673 A | 11/1982 | Bross et al. |
| 4,368,430 A | 1/1983 | Dale et al. |
| 4,410,926 A | 10/1983 | Hafner et al. |
| 4,437,533 A | 3/1984 | Bierkarre et al. |
| 4,514,083 A | 4/1985 | Fukuoka |
| 4,588,993 A | 5/1986 | Babij et al. |
| 4,636,612 A | 1/1987 | Cullen |
| 4,638,324 A | 1/1987 | Hannan |
| 4,675,522 A | 6/1987 | Arunkumar |
| 4,768,962 A | 9/1988 | Kupfer et al. |
| 4,818,990 A | 4/1989 | Fernandes |
| 4,820,986 A | 4/1989 | Mansfield et al. |
| 4,945,305 A | 7/1990 | Blood |
| 4,958,328 A | 9/1990 | Stubblefield |
| 5,019,721 A | 5/1991 | Martens et al. |
| 5,038,103 A | 8/1991 | Scarzello et al. |
| 5,113,136 A | 5/1992 | Hayashi et al. |
| 5,134,369 A | 7/1992 | Lo et al. |
| 5,189,368 A | 2/1993 | Chase |
| 5,200,855 A | 4/1993 | Meredith et al. |
| 5,245,347 A | 9/1993 | Bonta et al. |
| 5,252,912 A | 10/1993 | Merritt et al. |
| 5,301,096 A | 4/1994 | Klontz et al. |
| 5,384,109 A | 1/1995 | Klaveness et al. |
| 5,396,802 A | 3/1995 | Moss |
| 5,420,549 A | 5/1995 | Prestage |
| 5,425,179 A | 6/1995 | Nickel et al. |
| 5,427,915 A | 6/1995 | Ribi et al. |
| 5,548,279 A | 8/1996 | Gaines |
| 5,568,516 A | 10/1996 | Strohallen et al. |
| 5,586,069 A | 12/1996 | Dockser |
| 5,597,762 A | 1/1997 | Popovici et al. |
| 5,638,472 A | 6/1997 | Van Delden |
| 5,694,375 A | 12/1997 | Woodall |
| 5,719,497 A | 2/1998 | Veeser et al. |
| 5,731,996 A | 3/1998 | Gilbert |
| 5,764,061 A | 6/1998 | Asakawa et al. |
| 5,818,352 A | 10/1998 | McClure |
| 5,846,708 A | 12/1998 | Hollis et al. |
| 5,888,925 A | 3/1999 | Smith et al. |
| 5,907,420 A | 5/1999 | Chraplyvy et al. |
| 5,907,907 A | 6/1999 | Ohtomo et al. |
| 6,042,249 A | 3/2000 | Spangenberg |
| 6,057,684 A | 5/2000 | Murakami et al. |
| 6,124,862 A | 9/2000 | Boyken et al. |
| 6,130,753 A | 10/2000 | Hopkins et al. |
| 6,144,204 A | 11/2000 | Sementchenko |
| 6,195,231 B1 | 2/2001 | Sedlmayr et al. |
| 6,360,173 B1 | 3/2002 | Fullerton |
| 6,398,155 B1 | 6/2002 | Hepner et al. |
| 6,433,944 B1 | 8/2002 | Nagao et al. |
| 6,472,651 B1 | 10/2002 | Ukai |
| 6,472,869 B1 | 10/2002 | Upschulte et al. |
| 6,504,365 B2 | 1/2003 | Kitamura |
| 6,542,242 B1 | 4/2003 | Yost et al. |
| 6,621,578 B1 | 9/2003 | Mizoguchi |
| 6,636,146 B1 | 10/2003 | Wehoski |
| 6,686,696 B2 | 2/2004 | Mearini et al. |
| 6,690,162 B1 | 2/2004 | Schopohl et al. |
| 6,765,487 B1 | 7/2004 | Holmes et al. |
| 6,788,722 B1 | 9/2004 | Kennedy et al. |
| 6,809,829 B1 | 10/2004 | Takata et al. |
| 7,118,657 B2 | 10/2006 | Golovchenko et al. |
| 7,221,164 B1 | 5/2007 | Barringer |
| 7,277,161 B2 | 10/2007 | Claus |
| 7,305,869 B1 | 12/2007 | Berman et al. |
| 7,307,416 B2 | 12/2007 | Islam et al. |
| RE40,343 E | 5/2008 | Anderson |
| 7,413,011 B1 | 8/2008 | Chee et al. |
| 7,427,525 B2 | 9/2008 | Santori et al. |
| 7,448,548 B1 | 11/2008 | Compton |
| 7,471,805 B2 | 12/2008 | Goldberg |
| 7,474,090 B2 | 1/2009 | Islam et al. |
| 7,543,780 B1 | 6/2009 | Marshall et al. |
| 7,546,000 B2 | 6/2009 | Spillane et al. |
| 7,570,050 B2 | 8/2009 | Sugiura |
| 7,608,820 B1 | 10/2009 | Berman et al. |
| 7,705,599 B2 | 4/2010 | Strack et al. |
| 7,805,030 B2 | 9/2010 | Bratkovski et al. |
| 7,916,489 B2 | 3/2011 | Okuya |
| 7,983,812 B2 | 7/2011 | Potter |
| 8,022,693 B2 | 9/2011 | Meyersweissflog |
| 8,120,351 B2 | 2/2012 | Rettig et al. |
| 8,120,355 B1 | 2/2012 | Stetson |
| 8,138,756 B2 | 3/2012 | Barclay et al. |
| 8,193,808 B2 | 6/2012 | Fu et al. |
| 8,294,306 B2 | 10/2012 | Kumar et al. |
| 8,311,767 B1 | 11/2012 | Stetson |
| 8,334,690 B2 | 12/2012 | Kitching et al. |
| 8,415,640 B2 | 4/2013 | Babinec et al. |
| 8,471,137 B2 | 6/2013 | Adair et al. |
| 8,480,653 B2 | 7/2013 | Birchard et al. |
| 8,525,516 B2 | 9/2013 | Le Prado et al. |
| 8,547,090 B2 | 10/2013 | Lukin et al. |
| 8,574,536 B2 | 11/2013 | Boudou et al. |
| 8,575,929 B1 | 11/2013 | Wiegert |
| 8,686,377 B2 | 4/2014 | Twitchen et al. |
| 8,758,509 B2 | 6/2014 | Twitchen et al. |
| 8,803,513 B2 | 8/2014 | Hosek et al. |
| 8,885,301 B1 | 11/2014 | Heidmann |
| 8,913,900 B2 | 12/2014 | Lukin et al. |
| 8,933,594 B2 | 1/2015 | Kurs |
| 8,947,080 B2 | 2/2015 | Lukin et al. |
| 8,963,488 B2 | 2/2015 | Campanella et al. |
| 9,103,873 B1 | 8/2015 | Martens et al. |
| 9,157,859 B2 | 10/2015 | Walsworth et al. |
| 9,245,551 B2 | 1/2016 | El Hallak et al. |
| 9,249,526 B2 | 2/2016 | Twitchen et al. |
| 9,291,508 B1 | 3/2016 | Biedermann et al. |
| 9,369,182 B2 | 6/2016 | Kurs et al. |
| 9,541,610 B2 | 1/2017 | Kaup et al. |
| 9,551,763 B1 | 1/2017 | Hahn et al. |
| 9,557,391 B2 | 1/2017 | Egan et al. |
| 9,570,793 B2 | 2/2017 | Borodulin |
| 9,590,601 B2 | 3/2017 | Krause et al. |
| 9,680,338 B2 | 6/2017 | Malpas et al. |
| 9,689,679 B2 | 6/2017 | Budker et al. |
| 9,720,055 B1 | 8/2017 | Hahn et al. |
| 2002/0144093 A1 | 10/2002 | Inoue et al. |
| 2002/0167306 A1 | 11/2002 | Zalunardo et al. |
| 2003/0058346 A1 | 3/2003 | Bechtel et al. |
| 2003/0076229 A1 | 4/2003 | Blanpain et al. |
| 2003/0098455 A1 | 5/2003 | Amin et al. |
| 2003/0235136 A1 | 12/2003 | Akselrod et al. |
| 2004/0013180 A1 | 1/2004 | Giannakis et al. |
| 2004/0022179 A1 | 2/2004 | Giannakis et al. |
| 2004/0042150 A1 | 3/2004 | Swinbanks et al. |
| 2004/0081033 A1 | 4/2004 | Arieli et al. |
| 2004/0109328 A1 | 6/2004 | Dahl et al. |
| 2004/0247145 A1 | 12/2004 | Luo et al. |
| 2005/0031840 A1 | 2/2005 | Swift et al. |
| 2005/0068249 A1 | 3/2005 | Frederick Du Toit et al. |
| 2005/0099177 A1 | 5/2005 | Greelish |
| 2005/0112594 A1 | 5/2005 | Grossman |
| 2005/0126905 A1 | 6/2005 | Golovchenko et al. |

(56) References Cited

U.S. PATENT DOCUMENTS

| | | | |
|---|---|---|---|
| 2005/0130601 A1 | 6/2005 | Palermo et al. | |
| 2005/0134257 A1 | 6/2005 | Etherington et al. | |
| 2005/0138330 A1 | 6/2005 | Owens et al. | |
| 2005/0146327 A1 | 7/2005 | Jakab | |
| 2006/0012385 A1* | 1/2006 | Tsao | G01R 31/302 324/750.14 |
| 2006/0054789 A1 | 3/2006 | Miyamoto et al. | |
| 2006/0055584 A1 | 3/2006 | Waite et al. | |
| 2006/0062084 A1 | 3/2006 | Drew | |
| 2006/0071709 A1 | 4/2006 | Maloberti et al. | |
| 2006/0247847 A1 | 11/2006 | Carter et al. | |
| 2006/0255801 A1 | 11/2006 | Ikeda | |
| 2006/0291771 A1 | 12/2006 | Braunisch et al. | |
| 2007/0004371 A1 | 1/2007 | Okanobu | |
| 2007/0247147 A1 | 10/2007 | Xiang et al. | |
| 2007/0273877 A1 | 11/2007 | Kawano et al. | |
| 2008/0016677 A1 | 1/2008 | Creighton, IV | |
| 2008/0048640 A1 | 2/2008 | Hull et al. | |
| 2008/0078233 A1* | 4/2008 | Larson | G01N 29/022 73/24.04 |
| 2008/0089367 A1 | 4/2008 | Srinivasan et al. | |
| 2008/0204004 A1 | 8/2008 | Anderson | |
| 2008/0217516 A1 | 9/2008 | Suzuki et al. | |
| 2008/0239265 A1* | 10/2008 | Den Boef | G01N 21/956 355/53 |
| 2008/0253264 A1 | 10/2008 | Nagatomi et al. | |
| 2008/0266050 A1 | 10/2008 | Crouse et al. | |
| 2008/0299904 A1 | 12/2008 | Yi et al. | |
| 2009/0042592 A1 | 2/2009 | Cho et al. | |
| 2009/0058697 A1 | 3/2009 | Aas et al. | |
| 2009/0060790 A1* | 3/2009 | Okaguchi | G01N 29/022 422/68.1 |
| 2009/0079417 A1 | 3/2009 | Mort et al. | |
| 2009/0079426 A1 | 3/2009 | Anderson | |
| 2009/0132100 A1 | 5/2009 | Shibata | |
| 2009/0157331 A1 | 6/2009 | Van Netten | |
| 2009/0195244 A1 | 8/2009 | Mouget et al. | |
| 2009/0222208 A1 | 9/2009 | Speck | |
| 2009/0277702 A1 | 11/2009 | Kanada et al. | |
| 2009/0310650 A1 | 12/2009 | Chester et al. | |
| 2010/0004802 A1 | 1/2010 | Bodin et al. | |
| 2010/0015438 A1* | 1/2010 | Williams | C23C 16/006 428/332 |
| 2010/0015918 A1 | 1/2010 | Liu et al. | |
| 2010/0045269 A1 | 2/2010 | Lafranchise et al. | |
| 2010/0071904 A1 | 3/2010 | Burns et al. | |
| 2010/0102809 A1 | 4/2010 | May | |
| 2010/0134922 A1 | 6/2010 | Yamada et al. | |
| 2010/0157305 A1 | 6/2010 | Henderson | |
| 2010/0188081 A1 | 7/2010 | Lammegger | |
| 2010/0237149 A1 | 9/2010 | Olmstead | |
| 2010/0271016 A1 | 10/2010 | Barclay et al. | |
| 2010/0277121 A1 | 11/2010 | Hall et al. | |
| 2010/0308813 A1 | 12/2010 | Lukin et al. | |
| 2010/0315079 A1 | 12/2010 | Lukin et al. | |
| 2010/0326042 A1 | 12/2010 | McLean et al. | |
| 2011/0034393 A1 | 2/2011 | Justen et al. | |
| 2011/0059704 A1 | 3/2011 | Norimatsu et al. | |
| 2011/0062957 A1 | 3/2011 | Fu et al. | |
| 2011/0063957 A1 | 3/2011 | Isshiki et al. | |
| 2011/0066379 A1 | 3/2011 | Mes | |
| 2011/0120890 A1 | 5/2011 | MacPherson et al. | |
| 2011/0127999 A1 | 6/2011 | Lott et al. | |
| 2011/0165862 A1 | 7/2011 | Yu et al. | |
| 2011/0176563 A1* | 7/2011 | Friel | C30B 25/02 372/3 |
| 2011/0243267 A1 | 10/2011 | Won et al. | |
| 2011/0270078 A1* | 11/2011 | Wagenaar | A61B 5/055 600/411 |
| 2012/0016538 A1 | 1/2012 | Waite et al. | |
| 2012/0019242 A1 | 1/2012 | Hollenberg et al. | |
| 2012/0037803 A1 | 2/2012 | Strickland | |
| 2012/0044014 A1 | 2/2012 | Stratakos et al. | |
| 2012/0051996 A1 | 3/2012 | Scarsbrook et al. | |
| 2012/0063505 A1 | 3/2012 | Okamura et al. | |
| 2012/0087449 A1 | 4/2012 | Ling et al. | |
| 2012/0089299 A1 | 4/2012 | Breed | |
| 2012/0140219 A1 | 6/2012 | Cleary | |
| 2012/0181020 A1 | 7/2012 | Barron et al. | |
| 2012/0194068 A1 | 8/2012 | Cheng et al. | |
| 2012/0203086 A1 | 8/2012 | Rorabaugh et al. | |
| 2012/0232838 A1 | 9/2012 | Kemppi et al. | |
| 2012/0235633 A1 | 9/2012 | Kesler et al. | |
| 2012/0235634 A1 | 9/2012 | Hall et al. | |
| 2012/0245885 A1 | 9/2012 | Kimishima | |
| 2012/0257683 A1 | 10/2012 | Schwager et al. | |
| 2012/0281843 A1 | 11/2012 | Christensen et al. | |
| 2012/0326793 A1 | 12/2012 | Gan | |
| 2013/0043863 A1 | 2/2013 | Ausserlechner et al. | |
| 2013/0093424 A1 | 4/2013 | Blank et al. | |
| 2013/0127518 A1 | 5/2013 | Nakao | |
| 2013/0179074 A1 | 7/2013 | Haverinen | |
| 2013/0215712 A1 | 8/2013 | Geiser et al. | |
| 2013/0223805 A1 | 8/2013 | Ouyang et al. | |
| 2013/0265782 A1 | 10/2013 | Barrena et al. | |
| 2013/0270991 A1 | 10/2013 | Twitchen et al. | |
| 2013/0279319 A1 | 10/2013 | Matozaki et al. | |
| 2014/0012505 A1 | 1/2014 | Smith et al. | |
| 2014/0037932 A1 | 2/2014 | Twitchen et al. | |
| 2014/0044208 A1 | 2/2014 | Woodsum | |
| 2014/0061510 A1 | 3/2014 | Twitchen et al. | |
| 2014/0070622 A1 | 3/2014 | Keeling et al. | |
| 2014/0072008 A1 | 3/2014 | Faraon et al. | |
| 2014/0077231 A1 | 3/2014 | Twitchen et al. | |
| 2014/0081592 A1 | 3/2014 | Bellusci et al. | |
| 2014/0104008 A1 | 4/2014 | Gan | |
| 2014/0126334 A1 | 5/2014 | Megdal et al. | |
| 2014/0139322 A1 | 5/2014 | Wang et al. | |
| 2014/0154792 A1 | 6/2014 | Moynihan et al. | |
| 2014/0159652 A1 | 6/2014 | Hall et al. | |
| 2014/0166904 A1 | 6/2014 | Walsworth et al. | |
| 2014/0167759 A1 | 6/2014 | Pines et al. | |
| 2014/0168174 A1 | 6/2014 | Idzik et al. | |
| 2014/0180627 A1 | 6/2014 | Naguib et al. | |
| 2014/0191139 A1 | 7/2014 | Englund | |
| 2014/0191752 A1 | 7/2014 | Walsworth et al. | |
| 2014/0198463 A1 | 7/2014 | Klein | |
| 2014/0210473 A1 | 7/2014 | Campbell et al. | |
| 2014/0215985 A1 | 8/2014 | Pollklas | |
| 2014/0247094 A1 | 9/2014 | Englund et al. | |
| 2014/0265555 A1 | 9/2014 | Hall et al. | |
| 2014/0272119 A1 | 9/2014 | Kushalappa et al. | |
| 2014/0273826 A1 | 9/2014 | Want et al. | |
| 2014/0291490 A1 | 10/2014 | Hanson et al. | |
| 2014/0297067 A1 | 10/2014 | Malay | |
| 2014/0306707 A1 | 10/2014 | Walsworth et al. | |
| 2014/0327439 A1 | 11/2014 | Cappellaro et al. | |
| 2014/0335339 A1 | 11/2014 | Dhillon et al. | |
| 2014/0340085 A1 | 11/2014 | Cappellaro et al. | |
| 2014/0368191 A1 | 12/2014 | Goroshevskiy et al. | |
| 2015/0001422 A1 | 1/2015 | Englund et al. | |
| 2015/0009746 A1 | 1/2015 | Kucsko et al. | |
| 2015/0018018 A1 | 1/2015 | Shen et al. | |
| 2015/0022404 A1 | 1/2015 | Chen et al. | |
| 2015/0048822 A1 | 2/2015 | Walsworth et al. | |
| 2015/0054355 A1 | 2/2015 | Ben-Shalom et al. | |
| 2015/0061590 A1 | 3/2015 | Widmer et al. | |
| 2015/0090033 A1 | 4/2015 | Budker et al. | |
| 2015/0128431 A1 | 5/2015 | Kuo | |
| 2015/0137793 A1 | 5/2015 | Englund et al. | |
| 2015/0153151 A1 | 6/2015 | Kochanski | |
| 2015/0192532 A1 | 7/2015 | Clevenson et al. | |
| 2015/0192596 A1 | 7/2015 | Englund et al. | |
| 2015/0225052 A1 | 8/2015 | Cordell | |
| 2015/0235661 A1 | 8/2015 | Heidmann | |
| 2015/0253355 A1 | 9/2015 | Grinolds et al. | |
| 2015/0268373 A1 | 9/2015 | Meyer | |
| 2015/0269957 A1 | 9/2015 | El Hallak et al. | |
| 2015/0276897 A1 | 10/2015 | Leussler et al. | |
| 2015/0299894 A1* | 10/2015 | Markham | C30B 29/04 250/458.1 |
| 2015/0303333 A1 | 10/2015 | Yu et al. | |
| 2015/0314870 A1 | 11/2015 | Davies | |

(56) References Cited

U.S. PATENT DOCUMENTS

| | | | |
|---|---|---|---|
| 2015/0326030 A1 | 11/2015 | Malpas et al. | |
| 2015/0326410 A1 | 11/2015 | Krause et al. | |
| 2015/0374250 A1 | 12/2015 | Hatano et al. | |
| 2015/0377865 A1 | 12/2015 | Acosta et al. | |
| 2015/0377987 A1 | 12/2015 | Menon et al. | |
| 2016/0031339 A1 | 2/2016 | Geo | |
| 2016/0036529 A1 | 2/2016 | Griffith et al. | |
| 2016/0071532 A9 | 3/2016 | Heidmann | |
| 2016/0077167 A1 | 3/2016 | Heidmann | |
| 2016/0097702 A1 | 4/2016 | Zhao et al. | |
| 2016/0139048 A1 | 5/2016 | Heidmann | |
| 2016/0146904 A1 | 5/2016 | Stetson et al. | |
| 2016/0161429 A1 | 6/2016 | Englund et al. | |
| 2016/0214714 A1 | 7/2016 | Sekelsky | |
| 2016/0216304 A1 | 7/2016 | Sekelsky | |
| 2016/0216340 A1 | 7/2016 | Egan et al. | |
| 2016/0216341 A1* | 7/2016 | Boesch | G01R 33/032 |
| 2016/0221441 A1 | 8/2016 | Hall et al. | |
| 2016/0223621 A1 | 8/2016 | Kaup et al. | |
| 2016/0231394 A1 | 8/2016 | Manickam et al. | |
| 2016/0266220 A1 | 9/2016 | Sushkov et al. | |
| 2016/0291191 A1 | 10/2016 | Fukushima et al. | |
| 2016/0313408 A1 | 10/2016 | Hatano et al. | |
| 2016/0348277 A1 | 12/2016 | Markham et al. | |
| 2016/0356863 A1 | 12/2016 | Boesch et al. | |
| 2017/0010214 A1 | 1/2017 | Osawa et al. | |
| 2017/0010334 A1 | 1/2017 | Krause et al. | |
| 2017/0010338 A1 | 1/2017 | Bayat et al. | |
| 2017/0010594 A1 | 1/2017 | Kottapalli et al. | |
| 2017/0023487 A1 | 1/2017 | Boesch | |
| 2017/0068012 A2 | 3/2017 | Fisk | |
| 2017/0104426 A1 | 4/2017 | Mills | |
| 2017/0199156 A1 | 7/2017 | Villani et al. | |
| 2017/0205526 A1 | 7/2017 | Meyer | |
| 2017/0207823 A1 | 7/2017 | Russo et al. | |
| 2017/0211947 A1 | 7/2017 | Fisk | |
| 2017/0212046 A1 | 7/2017 | Cammerata | |
| 2017/0212177 A1 | 7/2017 | Coar et al. | |
| 2017/0212178 A1 | 7/2017 | Hahn et al. | |
| 2017/0212179 A1 | 7/2017 | Hahn et al. | |
| 2017/0212180 A1 | 7/2017 | Hahn et al. | |
| 2017/0212181 A1 | 7/2017 | Coar et al. | |
| 2017/0212182 A1 | 7/2017 | Hahn et al. | |
| 2017/0212183 A1 | 7/2017 | Egan et al. | |
| 2017/0212184 A1 | 7/2017 | Coar et al. | |
| 2017/0212185 A1 | 7/2017 | Hahn et al. | |
| 2017/0212186 A1 | 7/2017 | Hahn et al. | |
| 2017/0212187 A1 | 7/2017 | Hahn et al. | |
| 2017/0212190 A1 | 7/2017 | Reynolds et al. | |
| 2017/0212258 A1 | 7/2017 | Fisk | |

FOREIGN PATENT DOCUMENTS

| | | |
|---|---|---|
| DE | 19600241 C2 | 8/2002 |
| DE | 10228536 A1 | 1/2003 |
| EP | 0 161 940 B1 | 12/1990 |
| EP | 0 718 642 | 6/1996 |
| EP | 0 726 458 | 8/1996 |
| EP | 1 505 627 | 2/2005 |
| EP | 1 685 597 | 8/2006 |
| EP | 1 990 313 | 11/2008 |
| EP | 2 163 392 | 3/2010 |
| EP | 2 495 166 A1 | 9/2012 |
| EP | 2 587 232 A1 | 5/2013 |
| EP | 2 705 179 | 3/2014 |
| EP | 2 707 523 | 3/2014 |
| EP | 2 745 360 | 6/2014 |
| EP | 2 769 417 | 8/2014 |
| EP | 2 790 031 | 10/2014 |
| EP | 2 837 930 A1 | 2/2015 |
| EP | 2 907 792 | 8/2015 |
| GB | 2 433 737 | 7/2007 |
| GB | 2423366 A | 8/2008 |
| GB | 2 482 596 | 2/2012 |
| GB | 2 483 767 | 3/2012 |
| GB | 2 486 794 | 6/2012 |
| GB | 2 490 589 | 11/2012 |
| GB | 2 491 936 | 12/2012 |
| GB | 2 493 236 | 1/2013 |
| GB | 2 495 632 A | 4/2013 |
| GB | 2 497 660 | 6/2013 |
| GB | 2 510 053 A | 7/2014 |
| GB | 2 515 226 | 12/2014 |
| GB | 2 522 309 | 7/2015 |
| GB | 2 526 639 | 12/2015 |
| JP | 3782147 B2 | 6/2006 |
| JP | 4800896 B2 | 10/2011 |
| JP | 2012-103171 | 5/2012 |
| JP | 2012-110489 | 6/2012 |
| JP | 2012-121748 | 6/2012 |
| JP | 2013-028497 | 2/2013 |
| JP | 5476206 B2 | 4/2014 |
| JP | 5522606 B2 | 6/2014 |
| JP | 5536056 B2 | 7/2014 |
| JP | 5601183 B2 | 10/2014 |
| JP | 2014-215985 | 11/2014 |
| JP | 2014-216596 | 11/2014 |
| JP | 2015-518562 A | 7/2015 |
| JP | 5764059 B2 | 8/2015 |
| JP | 2015-167176 | 9/2015 |
| JP | 2015-529328 | 10/2015 |
| JP | 5828036 B2 | 12/2015 |
| JP | 5831947 B2 | 12/2015 |
| WO | WO-87/04028 A1 | 7/1987 |
| WO | WO-88/04032 A1 | 6/1988 |
| WO | WO-95/33972 A1 | 12/1995 |
| WO | WO-2011/046403 A2 | 4/2011 |
| WO | WO-2011/153339 A1 | 12/2011 |
| WO | WO-2012/016977 A2 | 2/2012 |
| WO | WO-2012/084750 | 6/2012 |
| WO | WO-2013/059404 A1 | 4/2013 |
| WO | WO-2013/066446 A1 | 5/2013 |
| WO | WO-2013/066448 | 5/2013 |
| WO | WO-2013/093136 A1 | 6/2013 |
| WO | WO-2013/188732 A1 | 12/2013 |
| WO | WO-2013/190329 A1 | 12/2013 |
| WO | WO-2014/011286 A2 | 1/2014 |
| WO | WO-2014/099110 A2 | 6/2014 |
| WO | WO-2014/135544 A1 | 9/2014 |
| WO | WO-2014/135547 A1 | 9/2014 |
| WO | WO-2014/166883 A1 | 10/2014 |
| WO | WO-2014/210486 A1 | 12/2014 |
| WO | WO-2015/015172 A1 | 2/2015 |
| WO | WO-2015/142945 | 9/2015 |
| WO | WO-2015/157110 | 10/2015 |
| WO | WO-2015/157290 | 10/2015 |
| WO | WO-2015/158383 | 10/2015 |
| WO | WO-2015/193156 A1 | 12/2015 |
| WO | WO-2016/075226 A1 | 5/2016 |
| WO | WO-2016/118756 | 7/2016 |
| WO | WO-2016/118791 | 7/2016 |
| WO | WO-2016/122965 | 8/2016 |
| WO | WO-2016/122966 | 8/2016 |
| WO | WO-2016/126435 | 8/2016 |
| WO | WO-2016/126436 | 8/2016 |
| WO | WO-2016/190909 | 12/2016 |
| WO | WO-2017/007513 | 1/2017 |
| WO | WO-2017/007514 | 1/2017 |
| WO | WO-2017/014807 | 1/2017 |
| WO | WO-2017/039747 | 3/2017 |
| WO | WO-2017/095454 A1 | 6/2017 |
| WO | WO-2017/127079 A1 | 7/2017 |
| WO | WO-2017/127080 A1 | 7/2017 |
| WO | WO-2017/127081 A1 | 7/2017 |
| WO | WO-2017/127085 A1 | 7/2017 |
| WO | WO-2017/127090 A1 | 7/2017 |
| WO | WO-2017/127091 A1 | 7/2017 |
| WO | WO-2017/127093 A1 | 7/2017 |
| WO | WO-2017/127094 A1 | 7/2017 |
| WO | WO-2017/127095 A1 | 7/2017 |
| WO | WO-2017/127096 A1 | 7/2017 |

(56) References Cited

FOREIGN PATENT DOCUMENTS

| WO | WO-2017/127097 A1 | 7/2017 |
|---|---|---|
| WO | WO-2017/127098 A1 | 7/2017 |

OTHER PUBLICATIONS

"Findings from University of Stuttgart in physics reported," Science Letter, (Jul. 7, 2009), 2 pages.
"New Findings on Nitrogen from Ecole Normale Superieure Summarized (Magnetic imaging with an ensemble of nitrogen vacancy-centers in diamond)," Physics Week, pp. 1-2, (Jul. 21, 2015), 2 pages.
"Patent Issued for Diamond Sensors, Detectors, and Quantum Devices (U.S. Pat. No. 9,249,526)," Journal of Engineering, pp. 1-5 (Feb. 15, 2016), 5 pages.
"Researchers Submit Patent Application, 'Diamond Sensors, Detectors, and Quantum Devices', for Approval," Chemicals & Chemistry, pp. 1-7, (Apr. 11, 2014), 7 pages.
Acosta et al., "Broadband magnetometry by infrared-absorption detection of nitrogen-vacancy ensembles in diamond," Appl. Phys. Letters 97: 174104 (Oct. 29, 2010), 4 pages.
Acosta et al., "Diamonds with a high density of nitrogen-vacancy centers for magnetometry applications," Physical Review B 80(115202): 1-15 (Sep. 9, 2009), 15 pages.
Acosta et al., "Nitrogen-vacancy centers: physics and applications," MRS Bulletin 38(2): 127-130 (Feb. 2013), 4 pages.
Acosta, "Optical Magnetometry with Nitrogen-Vacancy Centers in Diamond," University of California Berkeley, (Spring 2011), 118 pages.
Aiello et al., "Composite-pulse magnetometry with a solid-state quantum sensor," Nature Communications 4(1419): 1-6 (Jan. 29, 2013), 7 pages.
Alam, "Solid-state 13C magic angle spinning NMR spectroscopy characterization of particle size structural variations in synthetic nanodiamonds," Materials Chemistry and Physics 85(2-3): 310-315 (Jun. 15, 2004), 6 pages.
Albrecht et al., "Coupling of nitrogen vacancy centres in nanodiamonds by means of phonons," New Journal of Physics 15(083014): 1-26 (Aug. 6, 2013), 27 pages.
Appel et al., "Nanoscale microwave imaging with a single electron spin in diamond," New Journal of Physics 17(112001): 1-6 (Nov. 3, 2015), 7 pages.
Arai et al., "Fourier magnetic imaging with nanoscale resolution and compressed sensing speed-up using electronic spins in diamond," Nature Nanotechnology 10: 859-864 (Aug. 10, 2015), 7 pages.
Aslam et al., "Single spin optically detected magnetic resonance with 60-90 GHz (E-band) microwave resonators," Review of Scientific Instruments 86(064704): 1-8 (Jun. 22, 2015), 9 pages.
Awschalom et al., "Diamond age of spintronics," Scientific American 297: 84-91 (Oct. 2007), 8 pages.
Babamoradi et al., "Correlation between entanglement and spin density in nitrogen-vacancy center of diamond," European Physical Journal D 65: 597-603 (Dec. 1, 2011), 7 pages.
Babunts et al., "Diagnostics of NV defect structure orientation in diamond using optically detected magnetic resonance with a modulated magnetic field," Technical Physics Letters 41(6): 583-586 (Jun. 2015; first published online Jul. 14, 2015), 4 pages.
Babunts et al., "Temperature-scanned magnetic resonance and the evidence of two-way transfer of a nitrogen nuclear spin hyperfine interaction in coupled NV-N pairs in diamond," JETP Letters 95(8): 429-432 (Jun. 27, 2012), 4 pages.
Bagguley et al., "Zeeman effect of acceptor states in semiconducting diamond," Journal of the Physical Society of Japan 21(Supplement): 244-248 (1966), 7 pages.
Balasubramanian et al., "Nanoscale imaging magnetometry with diamond spins under ambient conditions," Nature 455: 648-651 (Oct. 2, 2008), 5 pages.
Balmer et al., "Chemical Vapour deposition synthetic diamond: materials technology and applications," J. of Physics: Condensed Matter 21(36): 1-51 (Aug. 19, 2009), 51 pages.
Baranov et al., "Enormously High Concentrations of Fluorescent Nitrogen-Vacancy Centers Fabricated by Sintering of Detonation Nanodiamonds," Small 7(11): 1533-1537 (Jun. 6, 2011; first published online Apr. 26, 2011), 5 pages.
Barfuss et al., "Strong mechanical driving of a single electron spin," Nature Physics 11: 820-824 (Aug. 3, 2015), 6 pages.
Barry et al., "Optical magnetic detection of single-neuron action potentials using quantum defects in diamond," as submitted to Quantum Physics on Feb. 2, 2016, 23 pages.
Bennett et al., "CVD Diamond for High Power Laser Applications," SPIE 8603, High-Power Laser Materials Processing: Lasers, Beam Delivery, Diagnostics, and Applications II, 860307: 1-10 (Feb. 22, 2013), 10 pages.
Berman & Chernobrod, "Single-spin microscope with sub-nanoscale resolution based on optically detected magnetic resonance," SPIE 7608, Quantum Sensing and Nanophotonic Devices VII, 76080Y (Jan. 23, 2010), 4 pages.
Berman et al. "Measurement of single electron and nuclear spin states based on optically detected magnetic resonance," J. Physics: Conf. Series 38: 167-170 (2006), 5 pages.
Blakley et al., "Room-temperature magnetic gradiometry with fiber-coupled nitrogen-vacancy centers in diamond," Optics Letters 40(16): 3727-3730 (Aug. 15, 2015), 4 pages.
Bourgeois, et al., "Photoelectric detection of electron spin resonance of nitrogen-vacancy centres in diamond," Nature Communications 6(8577): 1-8 (Oct. 21, 2015), 8 pages.
Budker & Kimball, "Optical Magnetometry," Cambridge Press, (2013), 11 pages.
Budker & Romalis, "Optical Magnetometry," Nature Physics 3: 227-243 (Apr. 2007), 8 pages.
Casanova, et al., "Effect of magnetic field on phosphorus centre in diamond," Physica Status Solidi A 186(2): 291-295 (Jul. 30, 2001), 6 pages.
Castelletto, et al., "Frontiers in diffraction unlimited optical methods for spin manipulation, magnetic field sensing and imaging using diamond nitrogen vacancy defects," Nanophotonics 1(2): 139-153 (Nov. 2012), 15 pages.
Chapman, et al., "Anomalous saturation effects due to optical spin depolarization in nitrogen-vacancy centers in diamond nanocrystals," Physical Review B 86(045204): 1-8 (Jul. 10, 2012), 8 pages.
Chen et al., "Vector magnetic field sensing by a single nitrogen vacancy center in diamond," EPL 101(67003): 1-5 (Mar. 2013), 6 pages.
Chernobrod et al., "Improving the sensitivity of frequency modulation spectroscopy using nanomechanical cantilevers," Applied Physics Letters 85(17): 3896-3898 (Oct. 25, 2004), 3 pages.
Chernobrod et al., "Spin Microscope Based on Optically Detected Magnetic Resoncance," Journal of Applied Physics 97(014903): 1-3, (2005; first published online Dec. 10, 2004), 4 pages.
Childress et al., "Coherent dynamics of coupled electron and nuclear spin qubits in diamond," Science 314(5797): 281-285 (Oct. 13, 2006), 6 pages.
Chipaux et al., "Magnetic imaging with an ensemble of nitrogen vacancy-centers in diamond," European Physical Journal D 69(166): 1-10 (Jul. 2, 2015), 10 pages.
Chipaux et al., "Nitrogen vacancies (NV) centers in diamond for magnetic sensors and quantum sensing," SPIE 9370, Quantum Sensing and Nanophotonic Devices XII, 93701V (Feb. 8, 2015), 6 pages.
Chipaux, et al., "Wide bandwidth instantaneous radio frequency spectrum analyzer based on nitrogen vacancy centers in diamond," Applied Physics Letters 107(233502): 1-5 (2015), 6 pages.
Clevenson et al., "Broadband magnetometry and temperature sensing with a light-trapping diamond waveguide," Nature Physics 11: 393-397 (May 2015; first published online Apr. 6, 2015), 6 pages.
Constable, "Geomagnetic Spectrum, Temporal." In Encyclopedia of Geomagnetism and Paleomagnetism, pp. 353-355, Springer: Dordrecht, Netherlands (2007), 3 pages.

(56) References Cited

OTHER PUBLICATIONS

Cooper et al., "Time-resolved magnetic sensing with electronic spins in diamond," Nature Communications 5:3141: 1-7 (Jan. 24, 2014), 7 pages.
Creedon et al., "Strong coupling between P1 diamond impurity centers and a three-dimensional lumped photonic microwave cavity," Physical Review B 91(140408R): 1-5 (Apr. 24, 2015), 5 pages.
Davies, "Current problems in diamond: towards a quantitative understanding," Physica B 273-274: 15-13 (Dec. 15, 1999), 9 pages.
De Lange et al., "Single-Spin Magnetometry with Multipulse Sensing Sequences," Physical Review Letters 106(080802): 1-4 (Feb. 24, 2011), 4 pages.
Degen, "Scanning magnetic field microscope with a diamond single-spin sensor," Applied Physics Letters 92(243111): 1-3 (Jun. 17, 2008), 3 pages.
Delacroix et al., "Design, manufacturing, and performance analysis of mid-infrared achromatic half-wave plates with diamond subwavelength gratings," Applied Optics 51(24): 5897-5902 (Aug. 16, 2012), 6 pages.
Denatale et al., "Fabrication and characterization of diamond moth eye antireflective surfaces on Ge," J. of Applied Physics 71: 1388-1393 (Mar. 1992), 8 pages.
Dobrovitski et al., "Quantum Control over Single Spins in Diamond," Annual Review of Condensed Matter Physics 4: 23-50 (Apr. 2013), 30 pages.
Doherty et al., "The nitrogen-vacancy colour centre in diamond," Physics Reports 528: 1-45 (Jul. 1, 2013), 45 pages.
Doherty et al., "Theory of the ground-state spin of the NV-center in diamond," Physical Review B 85(205203): 1-21 (May 3, 2012), 21 pages.
Doi et al., "Pure negatively charged state of the NV center in n-type diamond," Physical Review B 93(081203): 1-6 (Feb. 3, 2016), 6 pages.
Drake et al., "Influence of magnetic field alignment and defect concentration on nitrogen-vacancy polarization in diamond," New Journal of Physics 18(013011): 1-8 (Jan. 2016; first published on Dec. 24, 2015), 9 pages.
Dreau et al., "Avoiding power broadening in optically detected magnetic resonance of single NV defects for enhanced dc magnetic field sensitivity," Physical Review B 84(195204): 1-8 (Nov. 23, 2011), 8 pages.
Dreau et al., "High-resolution spectroscopy of single NV defects coupled with nearby 13C nuclear spins in diamond," Physical Review B 85(134107): 1-7 (Apr. 20, 2012), 7 pages.
Dumeige et al., "Magnetometry with nitrogen-vacancy ensembles in diamond based on infrared absorption in a doubly resonant optical cavity," Physical Review B 87(155202): 1-9 (Apr. 8, 2013), 9 pages.
Epstein et al., "Anisotropic interactions of a single spin and dark-spin spectroscopy in diamond," Nature Physics 1: 94-98 (Nov. 2005), 5 pages.
Fedotov et al., "High-resolution magnetic field imaging with a nitrogen-vacancy diamond sensor integrated with a photonic-crystal fiber," Optics Letters 41(3): 472-475 (Feb. 1, 2016; published Jan. 25, 2016), 4 pages.
Fedotov et al., "Photonic-crystal-fiber-coupled photoluminescence interrogation of nitrogen vacancies in diamond nanoparticles," Laser Physics Letters 9(2): 151-154 (Feb. 2012; first published online Dec. 2, 2011), 5 pages.
Feng & Wei, "A steady-state spectral method to fit microwave absorptions of NV centers in diamonds: application to sensitive magnetic field sensing," Measurement Science & Technology 25(105102): 1-6 (Oct. 2014; first published online Aug. 29, 2014), 7 pages.
Freitas, et al., "Solid-State Nuclear Magnetic Resonance (NMR) Methods Applied to the Study of Carbon Materials," Chemistry and Physics of Carbon, vol. 31 (2012), 45 pages.
Geiselmann et al., "Fast optical modulation of the fluorescence from a single nitrogen-vacancy centre," Nature Physics 9: 785-789 (Dec. 2013; first published online Oct. 13, 2013), 5 pages.
Gombert & Blasi, "The Moth-Eye Effect—From Fundamentals to Commercial Exploitation," Functional Properties of Bio-Inspired Surfaces: 79-102, (Nov. 2009), 26 pages.
Gong et al., "Generation of Nitrogen-Vacancy Center Pairs in Bulk Diamond by Molecular Nitrogen Implantation," Chinese Physics Letters 33(2)(026105): 1-4 (Feb. 2016), 5 pages.
Gould et al., "An imaging magnetometer for bio-sensing based on nitrogen-vacancy centers in diamond," SPIE 8933, Frontiers in Biological Detection: From Nanosensors to Systems VI, 89330L (Mar. 18, 2014), 8 pages.
Gould et al., "Room-temperature detection of a single 19 nm superparamagnetic nanoparticle with an imaging magnetometer," Applied Physics Letters 105(072406): 1-4 (Aug. 19, 2014), 5 pages.
Gruber et al., "Scanning confocal optical microscopy and magnetic resonance on single defect centers," Science 276(5321): 2012-2014 (Jun. 27, 1997), 4 pages.
Haeberle et al., "Nanoscale nuclear magnetic imaging with chemical contrast," Nature Nanotechnology 10: 125-128 (Feb. 2015; first published online Jan. 5, 2015), 4 pages.
Haihua et al., "Design of wideband anti-reflective sub wavelength nanostructures," Infrared and Laser Engineering 40(2): 267-270 (Feb. 2011), 4 pages.
Hall et al., "Sensing of Fluctuating Nanoscale Magnetic Fields Using Nitrogen-Vacancy Centers in Diamond," Physical Review Letters 103(220802): 1-4 (Nov. 25, 2009), 4 pages.
Hanson et al., "Coherent Dynamics of a Single Spin Interacting with an Adjustable Spin Bath," Science 320(5874): 352-355 (Apr. 18, 2008), 5 pages.
Hanson et al., "Polarization and Readout of Coupled Single Spins in Diamond," Physical Review Letters 97(087601): 1-4 (Aug. 23, 2006), 4 pages.
Hanson et al., "Room-temperature manipulation and decoherence of a single spin in diamond," Physical Review 74(161203): 1-4 (Oct. 26, 2006), 4 pages.
Hanzawa et al., "Zeeman effect on the zero-phonon line of the NV center in synthetic diamond," Physica B 184(1-4): 137-140 (Feb. 1993), 4 pages.
Hegyi & Yablonovitch, "Molecular imaging by optically detected electron spin resonance of nitrogen-vacancies in nanodiamonds," Nano Letters 13(3): 1173-1178 (Mar. 2013; first published online Feb. 6, 2013), 6 pages.
Hegyi & Yablonovitch, "Nanodiamond molecular imaging with enhanced contrast and expanded field of view," Journal of Biomedical Optics 19(1)(011015): 1-8 (Jan. 2014), 9 pages.
Hilser et al., "All-optical control of the spin state in the NV-center in diamond," Physical Review B 86(125204): 1-8 (Sep. 14, 2012), 8 pages.
Hobbs, "Study of the Environmental and Optical Durability of AR Microstructures in Sapphire, ALON, and Diamond," SPIE 7302, Window and Dome Technologies and Materials XI, 73020J (Apr. 27, 2009), 14 pages.
Huebener et al., "ODMR of NV centers in nano-diamonds covered with N@C60," Physica Status Solidi B 245(10): 2013-2017 (Oct. 2008; first published online Sep. 8, 2008), 5 pages.
Huxter et al., "Vibrational and electronic dynamics of nitrogen-vacancy centres in diamond revealed by two-dimensional ultrafast spectroscopy," Nature Physics 9: 744-749 (Sep. 29, 2013), 6 pages.
International Search Report and Written Opinion of the International Searching Authority dated Apr. 1, 2016 from related PCT application PCT/US2016/014384, 12 pages.
International Search Report and Written Opinion of the International Searching Authority dated Apr. 11, 2016 from related PCT application PCT/US2016/014376, 12 pages.
International Search Report and Written Opinion of the International Searching Authority dated Apr. 11, 2016 from related PCT application PCT/US2016/014388, 14 pages.
International Search Report and Written Opinion of the International Searching Authority dated Apr. 11, 2016 from related PCT application PCT/US2016/014395, 15 pages.
International Search Report and Written opinion of the International Searching Authority dated Jul. 12, 2016, from related PCT application PCT/US2016/014287, 14 pages.

(56) References Cited

OTHER PUBLICATIONS

International Search Report and Written Opinion of the International Searching Authority dated Jul. 16, 2015, from related PCT application PCT/US2015/24723, 8 pages.
International Search Report and Written Opinion of the International Searching Authority dated Jul. 6, 2015, from related PCT application PCT/US2015/021093, 9 pages.
International Search Report and Written Opinion of the International Searching Authority dated Jul. 8, 2015, from related PCT application PCT/US2015/024265, 11 pages.
International Search Report and Written Opinion of the International Searching Authority dated Jun. 10, 2016 from related PCT application PCT/US2016/014290, 11 pages.
International Search Report and Written Opinion of the International Searching Authority dated Jun. 2, 2016, from related PCT application PCT/US2016/014386, 14 pages.
International Search Report and Written Opinion of the International Searching Authority dated Jun. 2, 2016, from related PCT application PCT/US2016/014387, 13 pages.
International Search Report and Written Opinion of the International Searching Authority dated Jun. 6, 2016, from related PCT application PCT/US2016/014291, 13 pages.
International Search Report and Written Opinion of the International Searching Authority dated Jun. 9, 2016 from related PCT application PCT/US2016/014333, 16 pages.
International Search Report and Written Opinion of the International Searching Authority dated Mar. 24, 2016 from related PCT application PCT/US2016/014336, 17 pages.
International Search Report and Written Opinion of the International Searching Authority dated Mar. 24, 2016 from related PCT application PCT/US2016/014297, 15 pages.
International Search Report and Written Opinion of the International Searching Authority dated Mar. 24, 2016 from related PCT application PCT/US2016/014392, 8 pages.
International Search Report and Written Opinion of the International Searching Authority dated Mar. 24, 2016 from related PCT application PCT/US2016/014403, 10 pages.
International Search Report and Written Opinion of the International Searching Authority dated Mar. 25, 2016, from related PCT application PCT/US2016/014363, 8 pages.
International Search Report and Written Opinion of the International Searching Authority dated Mar. 25, 2016, from related PCT application PCT/US2016/014389, 19 pages.
International Search Report and Written Opinion of the International Searching Authority dated Mar. 28, 2016, from related PCT application PCT/US2016/014380, 9 pages.
International Search Report and Written Opinion of the International Searching Authority dated Mar. 28, 2016, from related PCT application PCT/US2016/014394, 17 pages.
International Search Report and Written Opinion of the International Searching Authority dated Mar. 29, 2016 from related PCT application PCT/US2016/014325, 11 pages.
International Search Report and Written Opinion of the International Searching Authority dated Mar. 29, 2016 from related PCT application PCT/US2016/014330, 8 pages.
International Search Report and Written Opinion of the International Searching Authority dated Mar. 29, 2016 from related PCT application PCT/US2016/014328, 7 pages.
International Search Report and Written Opinion of the International Searching Authority dated Mar. 29, 2016 from related PCT application PCT/US2016/014385, 11 pages.
International Search Report and Written Opinion of the International Searching Authority dated Mar. 30, 2016 from related PCT application PCT/US2016/014298, 14 pages.
International Search Report and Written Opinion of the International Searching Authority dated Mar. 31, 2016 from related PCT application PCT/US2016/014375, 11 pages.
International Search Report and Written Opinion of the International Searching Authority dated Mar. 31, 2016 from related PCT application PCT/US2016/014396, 11 pages.
International Search Report and Written Opinion of the International Searching Authority dated May 26, 2016, 2016 from related PCT application PCT/US2016/014331, 15 pages.
Ivady et al., "Pressure and temperature dependence of the zero-field splitting in the ground state of NV centers in diamond: A first-principles study," Physical Review B 90(235205): 1-8 (Dec. 2014), 8 pages.
Jarmola et al., "Temperature- and Magnetic-Field-Dependent Longitudinal Spin Relaxation in Nitrogen-Vacancy Ensembles in Diamond," Physical Review Letters 108 (197601): 1-5 (May 2012), 5 pages.
Jensen et al., "Light narrowing of magnetic resonances in ensembles of nitrogen-vacancy centers in diamond," Physical Review B 87(014115): 1-10 (Jan. 2013), 10 pages.
Kailath, "Linear Systems," Prentice Hall, (1979), 6 pages.
Karlsson et al., "Diamond micro-optics: microlenses and antireflection structures surfaces for the infrared spectral region," Optics Express 11(5): 502-507 (Mar. 10, 2003), 6 pages.
Khan & Hemmer, "Noise limitation in nano-scale imaging," Proceedings of SPIE vol. 5842: 302-305, (Dec. 2005), 7 pages.
Kim et al., "Electron spin resonance shift and linewidth broadening of nitrogen-vacancy centers in diamond as a function of electron irradiation dose," Applied Physics Letters 101(082410): 1-5 (Aug. 2012), 6 pages.
Kim et al., "Jahn-Teller Splitting and Zeeman Effect of Acceptors in Diamond," Physica B 273-274: 647-627 (Jul. 1999), 4 pages.
Kim et al., "Magnetospectroscopy of acceptors in 'blue' diamonds," Physica B 302-301: 88-100 (Aug. 2001), 13 pages.
Kim et al., "Zeeman effect of electronic Raman lines of accepters in elemental semiconductors: Boron in blue diamond," Physical Review B 62(12): 8038-8052 (Sep. 2000), 15 pages.
King et al., "Optical polarization of 13C nuclei in diamond through nitrogen vacancy centers," Physical Review B 81(073201): 1-4 (Feb. 2010), 4 pages.
Kok et al., "Materials Science: Qubits in the pink," Nature 444(2): 49 (Nov. 2006), 1 page.
Konenko et al., "Formation of antireflective surface structures on diamond films by laser patterning," Applied Physics A 68:99-102 (Jan. 1999), 4 pages.
Kraus et al., "Magnetic field and temperature sensing with atomic-scale spin defects in silicon carbide," Scientific Reports 4(5303): 1-8 (Jul. 4, 2014), 8 pages.
Lai et al., "Influence of a static magnetic field on the photoluminescence of an ensemble of nitrogen-vacancy color centers in a diamond single-crystal," Applied Physics Letters 95, (Sep. 2009), 4 pages.
Lai et al., "Optically detected magnetic resonance of a single Nitrogen-Vacancy electronic spin in diamond nanocrystals," CLEO/EQEC, (Jun. 14-19, 2009), 1 page.
Laraoui et al., "Nitrogen-vacancy assisted magnetometry of paramagnetic centers in an individual diamond nanocrystal," Nano Letters 12: 3477-3482 (Jul. 2012) 6 pages.
Lazariev et al., "A nitrogen-vacancy spin based molecular structure microscope using multiplexed projection reconstruction," Scientific Reports 5(14130): 1-8 (Sep. 15, 2015), 8 pages.
Le Sage et al., "Efficient photon detection from color centers in a diamond optical waveguide," Phys. Rev. B 85: 121202(R), pp. 121202-1-121202-4, (Mar. 2012), 4 pages.
Lee et al., "Vector magnetometry based on S=3/2 electronic spins," Physical Review B 92 (115201): 1-7 (Sep. 2015), 7 pages.
Lesik et al., "Preferential orientation of NV defects in CVD diamond films grown on (113)-oriented substrates," Diamond and Related Materials 56: 47-53 (Jun. 2015), 7 pages.
Levchenko et al., "Inhomogeneous broadening of optically detected magnetic resonance of the ensembles of nitrogen-vacancy centers in diamond by interstitial carbon atoms," Applied Physics Letters 106, (Mar. 2015; published online Mar. 9, 2015), 6 pages.
Liu et al., "Electron spin studies of nitrogen vacancy centers in nanodiamonds," Acta Physica Sinica 62(16) 164208: 1-5 (Aug. 2013), 5 pages.
Liu et al., "Fiber-integrated diamond-based magnetometer," Applied Physics Letters 103(143105): 1-4 (Sep. 2013), 5 pages.

(56) References Cited

OTHER PUBLICATIONS

MacLaurin et al., "Nanoscale magnetometry through quantum control of nitrogen-vacancy centres in rotationally diffusing nanodiamonds," New Journal of Physics 15, (Jan. 2013), 16 pages.
MacQuarie et al., "Mechanical spin control of nitrogen-vacancy centers in diamond," Retrieved from http://www.arxiv.org/pdf/1306.6356.pdf, pp. 1-8, (Jun. 2013), 8 pages.
Macs et al., "Diamond as a magnetic field calibration probe," Journal of Physics D: Applied Physics 37, (Apr. 2004; published Mar. 17, 2004), 6 pages.
Maletinsky et al., "A robust scanning diamond sensor for nanoscale imaging with single nitrogen-vacancy centres," Nature Nanotechnology 7: 320-324, (May 2012; published online Apr. 15, 2012), 5 pages.
Mamin et al., "Multipulse Double-Quantum Magnetometry with Near-Surface Nitrogen-Vacancy Centers," Physical Review Letters 13(030803): 1-5 (Jul. 2014), 5 pages.
Mamin et al., "Nanoscale Nuclear Magnetic Resonance with a Nitrogen-Vacancy Spin Sensor," Science 339, (Feb. 1, 2013), 5 pages.
Manson et al., "GR transitions in diamond: magnetic field measurements," Journal of Physics C Solid St. Phys 13: L1005-L1009, (Nov. 1980), 6 pages.
Massachusetts Institute of Technology, "Wide-Field Imaging Using Nitrogen Vacancies," in Patent Application Approval Process, Physics Week: 1-5, (Jan. 20, 2015), 5 pages.
Matsuda et al., "Development of a plastic diamond anvil cell for high pressure magneto-photoluminescence in pulsed high magnetic fields," International Journal of Modern Physics B 18(27-29), (Nov. 2004), 7 pages.
Maze et al., "Nanoscale magnetic sensing using spin qubits in diamond," Proc. SPIE 7225, Advanced Optical Concepts in Quantum Computing, Memory, and Communication II, 722509 (Feb. 2, 2009) 8 pages.
Maze et al., "Nanoscale magnetic sensing with an individual electronic spin in diamond," Nature Physics 455: 644-647 (Oct. 2, 2008), 5 pages.
Meijer et al., "Generation of single color centers by focused nitrogen implantation," Applied Physics Letters 87(261909): 1-3 (Dec. 2005), 4 pages.
Millot et al., "High-field Zeeman and Paschen-Back effects at high pressure in oriented ruby," Physical Review B 78 (155125): 1-7 (Oct. 2008), 7 pages.
Moriyama et al., "Importance of electron-electron interactions and Zeeman splitting in single-wall carbon nanotube quantum dots," Physica E 26: 473-476 (Feb. 2005), 4 pages.
Mrozek et al., "Circularly polarized microwaves for magnetic resonance study in the GHz range: Application to nitrogen-vacancy in diamonds," Applied Physics Letters, pp. 1-4 (Jul. 2015), 4 pages.
Nagl et al., "Improving surface and defect center chemistry of fluorescent nanodiamonds for imaging purposes—a review," Analytical and Bioanalaytical Chemistry 407: 7521-7536 (Oct. 2015; published online Jul. 29, 2015), 16 pages.
Neumann et al., "Excited-state spectroscopy of single NV defects in diamond using optically detected magnetic resonance," New Journal of Physics 11(013017): 1-10, (Jan. 2009), 11 pages.
Nizovtsev & Kilin, "Optically Detected Magnetic Resonance Spectra of the 14NV-13C Spin Systems in Diamond: Analytical Theory and Experiment," Doklady of the National Academy of Sciences of Belarus, (2013), 27 pages with English machine translation.
Nizovtsev et al., "Modeling fluorescence of single nitrogen-vacancy defect centers in diamond," Physica B—Condensed Matter, 608-611 (Dec. 2001), 4 pages.
Nizovtsev et al., "Theoretical study of hyperfine interactions and optically detected magnetic resonance spectra by simulation of the C-291(NV)H-(172) diamond cluster hosting nitrogen-vacancy center," New Journal of Physics 16(083014): 1-21 (Aug. 2014), 22 pages.
Nobauer et al., "Smooth optimal quantum control for robust solid state spin magnetometry," Retrieved from http://www.arxiv.org/abs/1412.5051, pp. 1-12, (Dec. 2014), 12 pages.
Nowodzinski et al., "Nitrogen-Vacancy centers in diamond for current imaging at the redistributive layer level of Integrated Circuits," Microelectronics Reliability 55: 1549-1553 (Aug. 2015), 5 pages.
Nusran et al., "Optimizing phase-estimation algorithms for diamond spin magnetometry," Physical Review B 90(024422): 1-12 (Jul. 2014), 12 pages.
Ohashi et al., "Negatively Charged Nitrogen-Vacancy Centers in a 5 nm Thin 12C Diamond Film," Nano Letters 13: 4733-4738 (Oct. 2013), 6 pages.
Plakhotnik et al., "Super-Paramagnetic Particles Chemically Bound to Luminescent Diamond : Single Nanocrystals Probed with Optically Detected Magnetic Resonance," Journal of Physical Chemistry C 119: 20119-20124 (Aug. 2015), 6 pages.
Polatomic. "AN/ASQ-233A Digital Magnetic Anomaly Detective Set." Retrieved May 9, 2016, from http://polatomic.com/images/DMAD_Data_Sheet_09-2009.pdf (2009), 1 page.
Poole, "What is GMSK Modulation—Gaussian Minimum Shift Keying." Radio-Electronics, retrieved from https://web.archive.org/web/20150403045840/http://www.radio-electronics.com/info/rf-technology-design/pm-phase-modulation/what-is-gmsk-gaussian-minimum-shift-keyingtutorial.php (Apr. 3, 2015), 4 pages.
Rabeau et al., "Implantation of labelled single nitrogen vacancy centers in diamond using 15N," Applied Physics Letters 88, (Jan. 2006), 4 pages.
Ranjbar et al., "Many-electron states of nitrogen-vacancy centers in diamond and spin density calculations," Physical Review B 84(165212): 1-6 (Oct. 2011), 6 pages.
Reynhardt, "Spin-lattice relaxation of spin-1/2 nuclei in solids containing diluted paramagnetic impurity centers. I. Zeeman polarization of nuclear spin system," Concepts in Magnetic Resonance Part A, pp. 20-35, (Sep. 2003), 16 pages.
Rogers et al., "Singlet levels of the NV(−) centre in diamond," New Journal of Physics 17, (Jan. 27, 2015), 13 pages.
Rondin et al., "Magnetometry with nitrogen-vacancy defects in diamond," Reports on Progress in Physics 77(056503) 1-26 (May 6, 2014), 27 pages.
Rondin et al., "Nanoscale magnetic field mapping with a single spin scanning probe magnetometer," Applied Physics Letters 100, (Apr. 2012), 5 pages.
Sarkar et al., "Magnetic properties of graphite oxide and reduced graphene oxide," Physica E 64: 78-82 (Nov. 2014), 5 pages.
Scheuer et al., "Accelerated 2D magnetic resonance spectroscopy of single spins using matrix completion," Scientific Reports 5(17728): 1-8 (Dec. 3, 2015), 8 pages.
Schirhagl et al., "Nitrogen-vacancy centers in diamond: Nanoscale sensors for physics and biology," Annual Review of Physical Chemistry 65: 83-105 (Jan. 2014), 26 pages.
Schoenfeld & Harneit, "Real time magnetic field sensing and imaging using a single spin in diamond," Physical Review Letters 106(030802): 1-4 (Jan. 2011), 4 pages.
Sedov et al., "Si-doped nano- and microcrystalline diamond films with controlled bright photoluminescence of silicon-vacancy color centers," Diamond and Related Materials 56: 23-28 (Jun. 2015; available online Apr. 18, 2015), 6 pages.
Shames et al., "Magnetic resonance tracking of fluorescent nanodiamond fabrication," Journal of Physics D: Applied Physics 48(155302): 1-13 (Apr. 2015; published Mar. 20, 2015), 14 pages.
Shao et al., "Diamond Color Center Based FM Microwave Demodulator," in Conference on Lasers and Electro-Optics, OSA Technical Digest (online) (Optical Society of America), paper JTh2A.136, (Jun. 5-10, 2016), 2 pages.
Simanovskaia et al., "Sidebands in optically detected magnetic resonance signals of nitrogen vacancy centers in diamond," Physical Review B 87(224106): 1-11 (Jun. 2013), 11 pages.
Sotoma et al., "Effective production of fluorescent nanodiamonds containing negatively-charged nitrogen-vacancy centers by ion irradiation," Diamond and Related Materials 49: 33-38 (Oct. 2014), 6 pages.

(56) References Cited

OTHER PUBLICATIONS

Steiner et al., "Universal enhancement of the optical readout fidelity of single electron spins at nitrogen-vacancy centers in diamond," Physical Review B 81(035205): 1-6 (Jan. 2010), 6 pages.
Steinert et al., "High-sensitivity magnetic imaging using an array of spins in diamond," Rev. Sci. Inst. 81(043705): 1-5 (Apr. 2010), 5 pages.
Stepanov et al., "High-frequency and high-field optically detected magnetic resonance of nitrogen-vacancy centers in diamond," Applied Physics Letters 106, (Feb. 2015), 5 pages.
Sternschulte et al., "Uniaxial stress and Zeeman splitting of the 1.681 eV optical center in a homoepitaxial CVD diamond film," Diamond and Related Materials 4: 1189-1192 (Sep. 1995), 4 pages.
Storteboom et al., "Lifetime investigation of single nitrogen vacancy centres in nanodiamonds," Optics Express 23(9): 11327-11333 (May 4, 2015; published Apr. 22, 2015), 7 pages.
Tahara et al., "Quantifying selective alignment of ensemble nitrogen-vacancy centers in (111) diamond," Applied Physics Letters 107:193110 (Nov. 2015; published online Nov. 13, 2015), 5 pages.
Taylor et al., "High-sensitivity diamond magnetometer with nanoscale resolution," Nature Physics 4: 810-816 (Oct. 2008), 7 pages.
Terblanche et al., "13C spin-lattice relaxation in natural diamond: Zeeman relaxation at 4.7 T and 300 K due to fixed paramagnetic nitrogen defects," Solid State Nuclear Magnetic Resonance 20: 1-22 (Aug. 2001), 22 pages.
Terblanche et al., "13C spin-lattice relaxation in natural diamond: Zeeman relaxation in fields of 500 to 5000 G at 300 K due to fixed paramagnetic nitrogen defects," Solid State Nuclear Magnetic Resonance 19: 107-129 (May 2001), 23 pages.
Tetienne et al., "Magnetic-field-dependent photodynamics of single NV defects in diamond: an application to qualitative all-optical magnetic imaging," New Journal of Physics 14(103033): 1-5 (Oct. 19, 2012), 16 pages.
Tong et al., "A hybrid-system approach for W state and cluster state generation," Optics Communication 310: 166-172, (Jan. 2014; available online Aug. 12, 2013 ), 7 pages.
Uhlen et al., "New diamond nanofabrication process for hard x-ray zone plates," J. of Vacuum Science & Tech. B 29(6) (06FG03): 1-4 (Nov./Dec. 2011), 4 pages.
U.S. Notice of Allowance dated Apr. 20, 2016, from related U.S. Appl. No. 15/003,718, 9 pages.
U.S. Notice of Allowance dated Mar. 29, 2016, from related U.S. Appl. No. 15/003,590, 11 pages.
U.S. Office Action dated Jul. 29, 2016 from related U.S. Appl. No. 14/680,877, 8 pages.
U.S. Office Action dated May 13, 2016, from related U.S. Appl. No. 14/676,740, 15 pages.
U.S. Office Action dated May 6, 2016, from related U.S. Appl. No. 14/659,498, 20 pages.
Vershovskii & Dmitriev, "Combined excitation of an optically detected magnetic resonance in nitrogen-vacancy centers in diamond for precision measurement of the components of a magnetic field vector," Technical Physics Letters 41(11): 1026-1029 (Nov. 2015), 4 pages.
Vershovskii & Dmitriev, "Micro-scale three-component quantum magnetometer based on nitrogen-vacancy color centers in diamond crystal," Technical Physics Letters 41(4): 393-396 (Apr. 2015), 4 pages.
Wahlstrom et al., "Modeling Magnetic Fields Using Gaussian Processes," 2013 IEEE International Conference on Acoustics, Speech, and Signal Processing, pp. 3522-3526 (May 26-31, 2013), 5 pages.
Wang et al., "Optimizing ultrasensitive single electron magnetometer based on nitrogen-vacancy center in diamond," Chinese Science Bulletin, 58(24): 2920-2923, (Aug. 2013), 4 pages.
Webber et al., "Ab initio thermodynamics calculation of the relative concentration of NV- and NV0 defects in diamond," Physical Review B 85,(014102): 1-7 (Jan. 2012), 7 pages.
Wolf et al., "Subpicotesla Diamond Magnetometry," Physical Review X 5(041001): 1-10 (Oct. 2015), 10 pages.
Wolfe et al., "Off-resonant manipulation of spins in diamond via precessing magnetization of a proximal ferromagnet," Physical Review B 89(180406): 1-5 (May 2014), 5 pages.
Xue & Liu, "Producing GHZ state of nitrogen-vacancy centers in cavity QED," Journal of Modern Optics 60(6-7), (Mar. 2013), 8 pages.
Yang & Gu, "Novel calibration techniques for high pulsed-magnetic fields using luminescence caused by photo," (with English machine translation), Journal of Huazhong University of Science and Technology, (Jun. 2007), 11 pages.
Yavkin et al., "Defects in Nanodiamonds: Application of High-Frequency cw and Pulse EPR, ODMR," Applied Magnetic Resonance, 45: 1035-1049 (Oct. 2014; published online Sep. 10, 2014), 15 pages.
Yu et al., "Bright fluorescent nanodiamonds: no photobleaching and low cytotoxicity," J. Am. Chem. Soc., 127: 17604-17605 (Dec. 2005), 2 pages.
Zhang et al., "Laser-polarization-dependent and magnetically controlled optical bistability in diamond nitrogen-vacancy centers," Physics Letters A 377: 2621-2627 (Nov. 2013), 7 pages.
Zhang et al., "Laser-polarization-dependent spontaneous emission of the zero phonon line from single nitrogen-vacancy center in diamond," Chinese Physics B 24(3), (Apr. 2014), 13 pages.
Zhang et al., "Scalable quantum information transfer between nitrogen-vacancy-center ensembles," Annals of Physics, 355: 170-181 (Apr. 2015; available online Feb. 14, 2013), 12 pages.
Zhao et al., "Atomic-scale magnetometry of distant nuclear spin clusters via nitrogen-vacancy spin in diamond," Nature Nanotechnology, 5: 242-246 (Apr. 2011), 5 pages.
Teale, "Magnetometry with Ensembles of Nitrogen Vacancy Centers in Bulk Diamond," Master's Thesis, Massachusetts Institute of Technology Department of Electrical Engineering and Computer Science (Sep. 2015), 57 pages.
Fallah et al., "Multi-sensor approach in vessel magnetic wake imaging," Wave Motion 51(1): 60-76 (Jan. 2014), retrieved from http://www.sciencedirect.com/science/article/pii/S0165212513001133 (Aug. 21, 2016), 17 pages.
International Preliminary Report on Patentability dated Oct. 20, 2016 from related PCT application PCT/US2015/024723, 7 pages.
International Search Report and Written Opinion of the International Searching Authority dated Sep. 13, 2016 from related PCT application PCT/US16/14377, 11 pages.
Notice of Allowance dated Aug. 17, 2016, from related U.S. Appl. No. 15/003,718, 8 pages.
Notice of Allowance dated Sep. 8, 2016, from related U.S. Appl. No. 15/003,298, 10 pages.
Soykal et al., "Quantum metrology with a single spin-3/2 defect in silicon carbide," Mesoscale and Nanoscale Physics (May 24, 2016), retrieved from https://arxiv.org/abs/1605.07628 (Sep. 22, 2016), 9 pages.
U.S. Office Action dated Aug. 24, 2016 from related U.S. Appl. No. 14/676,740, 19 pages.
U.S. Office Action dated Oct. 14, 2016 from related U.S. Appl. No. 15/003,677, 13 pages.
U.S. Office Action dated Oct. 19, 2016 from related U.S. Appl. No. 15/218,821, 6 pages.
U.S. Office Action dated Nov. 2, 2016 from related U.S. Appl. No. 15/003,256, 19 pages.
Widmann et al., "Coherent control of single spins in silicon carbide at room temperature," Nature Materials, 14: 164-168 (Feb. 2015) (available online Dec. 1, 2014), 5 pages.
U.S. Appl. No. 14/659,498, filed Mar. 16, 2015.
U.S. Appl. No. 14/676,740, filed Apr. 1, 2015.
U.S. Appl. No. 15/003,678, filed Jan. 21, 2016.
U.S. Appl. No. 14/680,877, filed Apr. 7, 2015.
U.S. Appl. No. 14/866,730, filed Sep. 25, 2015.
U.S. Appl. No. 15/003,281, filed Jan. 21, 2016.
U.S. Appl. No. 15/003,292, filed Jan. 21, 2016.
U.S. Appl. No. 15/003,298, filed Jan. 21, 2016.
U.S. Appl. No. 15/003,309, filed Jan. 21, 2016.
U.S. Appl. No. 15/003,176, filed Jan. 21, 2016.

(56) References Cited

OTHER PUBLICATIONS

U.S. Appl. No. 15/003,145, filed Jan. 21, 2016.
U.S. Appl. No. 15/003,336, filed Jan. 21, 2016.
U.S. Appl. No. 15/003,558, filed Jan. 21, 2016.
U.S. Appl. No. 15/003,519, filed Jan. 21, 2016.
U.S. Appl. No. 15/003,677, filed Jan. 21, 2016.
U.S. Appl. No. 15/003,256, filed Jan. 21, 2016.
U.S. Appl. No. 15/003,577, filed Jan. 21, 2016.
U.S. Appl. No. 15/003,704, filed Jan. 21, 2016.
U.S. Appl. No. 15/003,718, filed Jan. 21, 2016.
U.S. Appl. No. 15/003,062, filed Jan. 21, 2016.
U.S. Appl. No. 15/003,652, filed Jan. 21, 2016.
U.S. Appl. No. 15/003,634, filed Jan. 21, 2016.
U.S. Appl. No. 15/003,670, filed Jan. 21, 2016.
U.S. Appl. No. 15/003,088, filed Jan. 21, 2016.
U.S. Appl. No. 15/003,797, filed Jan. 21, 2016.
U.S. Appl. No. 15/003,590, filed Jan. 21, 2016.
U.S. Appl. No. 15/003,206, filed Jan. 21, 2016.
U.S. Appl. No. 15/003,193, filed Jan. 21, 2016.
U.S. Appl. No. 15/003,617, filed Jan. 21, 2016.
U.S. Appl. No. 15/003,396, filed Jan. 21, 2016.
U.S. Appl. No. 15/003,177, filed Jan. 21, 2016.
U.S. Appl. No. 15/003,209, filed Jan. 21, 2016.
U.S. Appl. No. 15/179,957, filed Jun. 10, 2016.
U.S. Appl. No. 15/207,457, filed Jul. 11, 2016.
U.S. Appl. No. 15/218,821, filed Jul. 25, 2016.
GB Office Action dated Jan. 10, 2017, in related national stage application GB1618202.4.
Brenneis, et al. "Ultrafast electronic readout of diamond nitrogen-vacancy centres coupled to graphene." Nature nanotechnology 10.2 (2015): 135-139.
Chavez, et al. "Detecting Arctic oil spills with NMR: a feasibility study." Near Surface Geophysics 13.4 (Feb. 2015): 409-416.
Dale, et al. "Medical applications of diamond magnetometry: commercial viability." arXiv preprint arXiv:1705.01994 (May 8, 2017), pp. 1-7.
Fologea, et al. "Detecting single stranded DNA with a solid state nanopore." Nano Letters 5.10 (Aug. 15, 2005): 1905-1909.
Gaebel, et al. "Room-temperature coherent coupling of single spins in diamond." Nature Physics 2.6 (May 28, 2006): 408-413.
Heerema, et al. "Graphene nanodevices for DNA sequencing." Nature nanotechnology 11.2 (Feb. 3, 2016): 127-136.
International Search Report and Written Opinion of the International Searching Authority dated Apr. 4, 2017 from related PCT application PCT/US16/68366, 9 pages.
International Search Report and Written Opinion of the International Searching Authority dated Mar. 13, 2017 from related PCT application PCT/US2016/68320, 10 pages.
International Search Report and Written Opinion of the International Searching Authority dated Mar. 27, 2017 from related PCT application PCT/US16/68344, 6 pages.
International Search Report and Written Opinion of the International Searching Authority dated Mar. 31, 2017 from related PCT application PCT/US2016/066566, 11 pages.
International Search Report and Written Opinion of the International Searching Authority dated May 10, 2017 from related PCT application PCT/US17/19411, 8 pages.
International Search Report and Written Opinion of the International Searching Authority dated May 18, 2017 from related PCT application PCT/US2017/021593, 10 pages.
International Search Report and Written Opinion of the International Searching Authority dated May 19, 2017 from related PCT application PCT/US17/18099, 16 pages.
International Search Report and Written Opinion of the International Searching Authority dated May 3, 2017 from related PCT application PCT/US2017/018701, 8 pages.
International Search Report and Written Opinion of the International Searching Authority dated May 4, 2017 from related PCT application PCT/US2017/018709, 8 pages.
International Search Report and Written Opinion of the International Searching Authority dated May 8, 2017 from related PCT application PCT/US2017/17321, 17 pages.
Keyser "Enhancing nanopore sensing with DNA nanotechnology." Nature nanotechnology 11.2 (Feb. 2016): 106-108.
Lindsay "The promises and challenges of solid-state sequencing." Nature nanotechnology 11.2 (Feb. 2016): 109-111.
Matlashov, et al. "SQUIDs for magnetic resonance imaging at ultra-low magnetic field." PIERS online 5.5 (2009): 466-470.
Matlashov, et al. "SQUIDs vs. induction coils for ultra-low field nuclear magnetic resonance: experimental and simulation comparison." IEEE Transactions on Applied Superconductivity 21.3 (Jan. 1, 2012): 465-468.
Moessle, et al. "SQUID-detected magnetic resonance imaging in microtesla fields." Annu. Rev. Biomed. Eng. 9 (May 23, 2008): 389-413.
Pelliccione, et al., Two-dimensional nanoscale imaging of gadolinium spins via scanning probe relaxometry with a single spin in diamond, Phys. Rev. Applied 2.5, (Sep. 8, 2014): 054014 pp. 1-17.
Qiu et al., "Low-field NMR Measurement Procedure when SQUID Detection is Used," IEEE/CSC & ESAS European Superconductivity News Forum, No. 5, Jul. 2008.
Qiu, et al. "SQUID-detected NMR in Earth's magnetic field." Journal of Physics: Conference Series. vol. 97. No. 1. IOP Publishing, Mar. 2008, pp. 1-7.
Steinert et al., "Magnetic spin imaging under ambient conditions with sub-cellular resolution." Nature Comms 4:1607 (Mar. 19, 2013).
Sushkov, et al. "All-optical sensing of a single-molecule electron spin." Nano letters 14.11 (Nov. 7, 2013): 6443-6448.
Tetienne, et al. "Spin relaxometry of single nitrogen-vacancy defects in diamond nanocrystals for magnetic noise sensing." Physical Review B 87.23 (Apr. 3, 2013): 235436-1-235436-5.
U.S. Notice of Allowance dated Mar. 15, 2017, from related U.S. Appl. No. 15/351,862, 6 pages.
U.S. Notice of Allowance dated May 26, 2017 from U.S. Appl. No. 15/218,821, 7 pages.
U.S. Office Action dated Apr. 17, 2017, from related U.S. Appl. No. 15/003,558, 12 pages.
U.S. Office Action dated Mar. 1, 2017, from related U.S. Appl. No. 15/003,634, 7 pages.
U.S. Office Action dated Mar. 16, 2017, from related U.S. Appl. No. 15/218,821, 7 pages.
U.S. Office Action dated May 22, 2017, from related U.S. Appl. No. 15/003,206, 12 pages.
Wells, et al. "Assessing graphene nanopores for sequencing DNA." Nano letters 12.8 (Jul. 10, 2012): 4117-4123.
Wysocki et al., "Modified Walsh-Hadamard sequences for DS CDMA wireless systems." Int. J. Adaptive Control and Signal Processing 16(8): 589-602 (Oct. 2002; first published online Sep. 23, 2002), 25 pages.
International Search Report and Written Opinion of the International Searching Authority in PCT/US2016/014390 dated Feb. 15, 2017, 19 pages.
Notice of Allowance dated Dec. 13, 2016, from related U.S. Appl. No. 14/680,877, 8 pages.
Notice of Allowance dated Dec. 22, 2016, from related U.S. Appl. No. 14/659,498, 10 pages.
U.S. Notice of Allowance dated Feb. 14, 2017, from related U.S. Appl. No. 15/003,677, 8 pages.
U.S. Office Action dated Feb. 10, 2017, from related U.S. Appl. No. 14/676,740, 20 pages.
U.S. Office Action dated Feb. 10, 2017, from related U.S. Appl. No. 15/003,088, 12 pages.
U.S. Office Action dated Feb. 16, 2017, from related U.S. Appl. No. 15/204,675, 8 pages.
International Search Report and Written Opinion from related PCT application PCT/US2017/035315 dated Aug. 24, 2017, 7 pages.
U.S. Notice of Allowance on U.S. Appl. No. 14/676,740 dated Sep. 1, 2017, 7 pages.
U.S. Notice of Allowance on U.S. Appl. No. 15/003,206 dated Sep. 18, 2017, 11 pages.

(56) References Cited

OTHER PUBLICATIONS

U.S. Notice of Allowance on U.S. Appl. No. 15/476,636 dated Sep. 14, 2017, 10 pages.
U.S. Office Action on U.S. Appl. No. 15/003,292 dated Sep. 8, 2017, 8 pages.
Bucher et al, "High Resolution Magnetic Resonance Spectroscopy Using Solid-State Spins", May 25, 2017, downloaded from https://arxiv.org/ (arXiv.org > quant-ph > arXiv:1705.08887) on May 25, 2017, pp. 1-24.
International Search Report and Written Opinion of the International Searching Authority dated Jun. 1, 2017, from related PCT application PCT/US17/21811, 9 pages.
International Search Report and Written Opinion of the International Searching Authority dated Jun. 1, 2017, in related PCT application PCT/US17/22279, 20 pages.
International Search Report and Written Opinion of the International Searching Authority dated Jun. 15, 2017, from related PCT application PCT/US2017/024175, 10 pages.
International Search Report and Written Opinion of the International Searching Authority dated Jun. 9, 2017, from related patent application PCT/US2017/024181, 13 pages.
International Search Report and Written Opinion of the International Searching Authority dated Jun. 9, 2017, from related PCT application PCT/US2017/024179, 9 pages.
International Search Report and Written Opinion of the International Searching Authority dated Jul. 14, 2017, from related PCT application PCT/US2017/022118, 13 pages.
International Search Report and Written Opinion of the International Searching Authority dated Jul. 17, 2017, from related PCT application PCT/US2017/024177, 11 pages.
International Search Report and Written Opinion of the International Searching Authority dated Jul. 18, 2017, from related PCT application PCT/US2017/024167, 11 pages.
International Search Report and Written Opinion of the International Searching Authority dated Jul. 18, 2017, from related PCT application PCT/US2017/024173, 13 pages.
International Search Report and Written Opinion of the International Searching Authority dated Jul. 19, 2017, from related PCT application PCT/US2017/024171, 12 pages.
International Search Report and Written Opinion of the International Searching Authority dated Jun. 15, 2017, from related PCT application PCT/US2017/024182, 21 pages.
International Search Report and Written Opinion of the International Searching Authority dated Jun. 22, 2017, in related PCT application PCT/US2017/024180, 10 pages.
International Search Report and Written Opinion of the International Searching Authority dated Jun. 5, 2017, from related PCT application PCT/US2017/024169, 11 pages.
International Search Report and Written Opinion of the International Searching Authority dated Jun. 5, 2017, from related PCT application PCT/US2017/024174, 8 pages.
International Search Report and Written Opinion of the International Searching Authority dated Jun. 5, 2017, in related PCT application PCT/US2017/024168, 7 pages.
International Search Report and Written Opinion of the International Searching Authority dated Jun. 6, 2017, from related PCT application PCT/2017/024165, 9 pages.
International Search Report and Written Opinion of the International Searching Authority dated Jun. 6, 2017, from related PCT application PCT/US2017/024172, 9 pages.
Michaelovich et al., "Polarization Dependencies of the Nitrogen-Vacancy Center." Undergraduate Project Report, Ben-Gurion University, Aug. 2015, pp. 1-9.
Notice of Allowance dated Jun. 8, 2017, from related U.S. Appl. No. 15/351,862, 7 pages.
Sheinker et al., "Localization in 3-D Using Beacons of Low Frequency Magnetic Field." IEEE Transactions on Instrumentation and Measurement 62(12): 3194-3201 (Dec. 2013), 8 pages.
U.S. Notice of Allowance dated Aug. 11, 2017 from related U.S. Appl. No. 15/003,558, 5 pages.
U.S. Notice of Allowance dated Jul. 18, 2017 from related U.S. Appl. No. 15/003,634, 6 pages.
U.S. Notice of Allowance dated Jul. 24, 2017 from related U.S. Appl. No. 15/003,088, 12 pages.
U.S. Notice of Allowance dated Jun. 28, 2017 from related U.S. Appl. No. 15/003,256, 10 pages.
U.S. Office Action dated Aug. 15, 2017 from related U.S. Appl. No. 15/003,281, 12 pages.
U.S. Office Action dated Jul. 27, 2017 from related U.S. Appl. No. 15/003,577, 15 pages.
U.S. Office Action dated Jun. 1, 2017, from related U.S. Appl. No. 15/003,797, 29 pages.
U.S. Office Action dated Jun. 1, 2017, from related U.S. Appl. No. 15/179,957, 29 pages.
U.S. Office Action dated Jun. 12, 2017, from related U.S. Appl. No. 15/003,256, 9 pages.
U.S. Office Action dated Jun. 12, 2017, from related U.S. Appl. No. 15/003,336, 14 pages.
U.S. Office Action dated Jun. 16, 2017, from related U.S. Appl. No. 15/003,678, 15 pages.
U.S. Office Action dated Jun. 2, 2017, from related U.S. Appl. No. 15/476,636, 10 pages.
Wroble, "Performance Analysis of Magnetic Indoor Local Positioning System." Western Michigan University Master's Theses, Paper 609 (Jun. 2015), 42 pages.

* cited by examiner

HIGHER MAGNETIC SENSITIVITY THROUGH FLUORESCENCE MANIPULATION BY PHONON SPECTRUM CONTROL

CROSS REFERENCE TO RELATED APPLICATIONS

The present application is a Continuation of U.S. patent application Ser. No. 15/003,256, filed Jan. 21, 2016 and the contents of which are incorporated herein by reference in their entirety.

FIELD

The present invention generally relates to magnetometers, and more particularly, to higher magnetic sensitivity through fluorescence manipulation by phonon spectrum control.

BACKGROUND

A number of industrial applications including, but not limited to, medical devices, communication devices, long range magnetic imaging and navigation systems, as well as scientific areas such as physics and chemistry can benefit from magnetic detection and imaging with a device that has extraordinary sensitivity, ability to capture signals that fluctuate very rapidly (bandwidth) all with a substantive package that is extraordinarily small in size, efficient in power and infinitesimal in volume.

Atomic-sized nitrogen-vacancy (NV) centers in diamond lattices have been shown to have excellent sensitivity for magnetic field measurement and enable fabrication of small magnetic sensors that can readily replace existing-technology (e.g., Hall-effect) systems and devices. Diamond NV (DNV) sensors can be maintained in room temperature and atmospheric pressure and can even be used in liquid environments (e.g., for biological imaging). DNV-based magnetometry relies on measuring small changes on large signal background. The background signal is large because over half of the content is coming from NV states that do not contribute to the signal. The NV background overlaps with the desired NV− signal making it difficult to optically separate the background from the desired signals.

SUMMARY

According to various aspects of the subject technology, methods and systems are described for achieving higher magnetic sensitivity through fluorescence manipulation by phonon spectrum control. Manipulating the phonon content within the diamond by the subject technology alters the fluorescence spectrum. The alteration of the fluorescence spectrum results in narrower bandwidths allowing background suppression through optical filtering.

One implementation relates to a method for increasing magnetic sensitivity for a diamond nitrogen vacancy sensor. The method includes providing a diamond having nitrogen vacancies of a DNV sensor and an acoustic driver and acoustically driving the diamond with the acoustic driver to manipulate a phonon spectrum of the DNV sensor.

In some implementations, the acoustic driver acoustically drives the diamond parallel to the nitrogen vacancies of a lattice of the diamond. In other implementations, the acoustic drive acoustically drives the diamond parallel, orthogonal, or at any angle relative to the cut of the diamond. In some implementations, the acoustic driver is a piezoelectric acoustic driver. In some implementations, the method further includes applying a long pass filter to filter $NV^0$ photon emissions from $NV^-$ photon emissions. In some implementations, the method further includes modifying a shape of the diamond to manipulate the phonon spectrum based on resonance of the diamond from the shape. In some implementations, the method further includes matching an optical drive of the DNV sensor with a $NV^0$ zero phonon line.

Another implementation relates to a diamond nitrogen-vacancy sensor that includes a diamond having nitrogen vacancies, a photo detector configured to detect photon emissions from the diamond responsive to laser excitation of the diamond, and an acoustic driver configured to manipulate a phonon spectrum for the DNV sensor by acoustically driving the diamond.

In some implementations, the acoustic driver acoustically drives the diamond parallel to the nitrogen vacancies of a lattice of the diamond. In some implementations, the acoustic driver is a piezoelectric acoustic driver. In some implementations, the DNV sensor further includes a long pass filter to filter $NV^0$ photon emissions from $NV^-$ photon emissions detected by the photo detector. In some implementations, the diamond is formed to manipulate the phonon spectrum based on resonance of the diamond.

Yet another implementation relates to a diamond nitrogen-vacancy sensor that includes a diamond having nitrogen vacancies along several lattices, a photo detector configured to detect photon emissions from the diamond responsive to laser excitation of the diamond, and an acoustic driver configured to manipulate a phonon spectrum for the DNV sensor by acoustically driving the diamond. The diamond is shaped to manipulate the phonon spectrum based on resonance of the diamond for the plurality of lattices In some implementations, the acoustic driver acoustically drives the diamond parallel to the nitrogen vacancies of a lattice of the diamond. In some implementations, the acoustic driver is a piezoelectric acoustic driver. In some implementations, the DNV sensor further includes a long pass filter to filter $NV^0$ photon emissions from $NV^-$ photon emissions detected by the photo detector.

Still a further implementation relates to a method for determining an acoustic driving frequency for a diamond of a diamond nitrogen vacancy sensor. The method includes acoustically driving a diamond having nitrogen vacancies of a DNV sensor at a first frequency using an acoustic driver, detecting a first set of $NV^0$ photon emissions and a first set of $NV^-$ photon emissions from the DNV sensor, acoustically driving the diamond of the DNV sensor at a second frequency using the acoustic driver, detecting a second set of $NV^0$ photon emissions and a second set of $NV^-$ photon emissions from the DNV sensor, and selecting the second frequency for acoustically driving the diamond with the acoustic driver to manipulate a phonon spectrum based on a wavelength difference between a peak of the second set of $NV^0$ photon emissions and the second set of $NV^-$ photon emissions from the DNV sensor.

In some implementations, the acoustic driver acoustically drives the diamond parallel to the nitrogen vacancies of a lattice of the diamond. In some implementations, the acoustic driver is a piezoelectric acoustic driver. In some implementations, the method further includes applying a long pass filter to filter $NV^0$ photon emissions from $NV^-$ photon emissions detected by the photo. In some implementations, the method further includes modifying a shape of the diamond to manipulate the phonon spectrum based on resonance of the diamond.

BRIEF DESCRIPTION OF THE DRAWINGS

The details of one or more implementations are set forth in the accompanying drawings and the description below. Other features, aspects, and advantages of the disclosure will become apparent from the description, the drawings, and the claims, in which:

Figure 1:
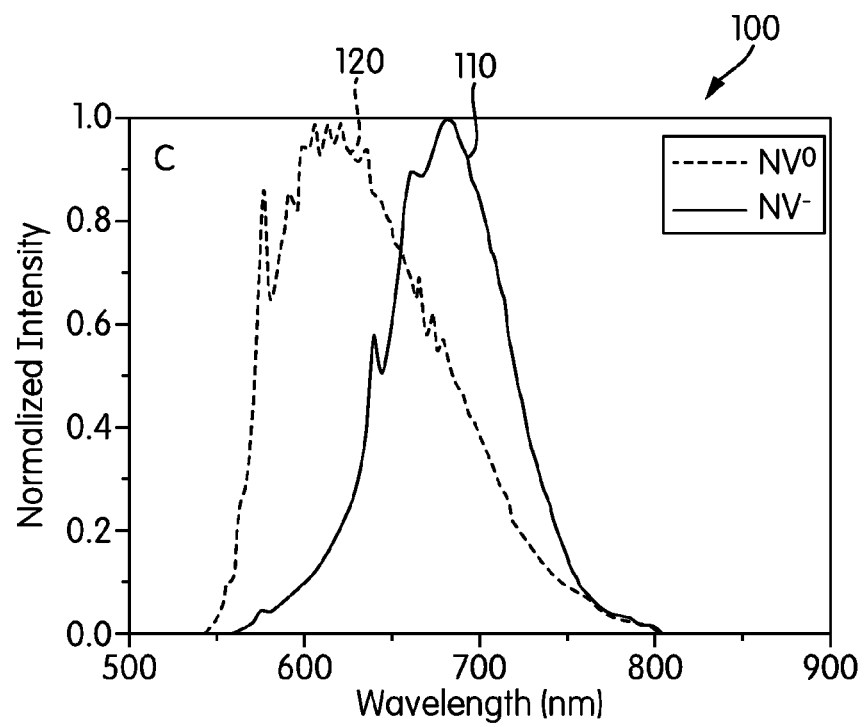
FIG. 1 is a graphical diagram depicting $NV^0$ and $NV^-$ photon intensity relative to wavelength without fluorescence manipulation.

It will be recognized that some or all of the figures are schematic representations for purposes of illustration. The figures are provided for the purpose of illustrating one or more embodiments with the explicit understanding that they will not be used to limit the scope or the meaning of the claims.

DETAILED DESCRIPTION

In some aspects of the present technology, methods and systems are disclosed for providing higher magnetic sensitivity magnetometers through fluorescence manipulation by phonon spectrum control. For diamond nitrogen-vacancy sensors, optical contrast between a resonant microwave frequency and an off resonant frequency fundamentally determines sensitivity. The total fluorescence of the system is a combination of the desired negatively charged NV centers (NV−) and the magnetically neutral uncharged NV centers)($NV^0$). The subject technology can manipulate the phonon spectrum to alter the phonon sideband of fluorescence spectrum of both the $NV^0$ and $NV^-$ centers. During room temperature operation, the $NV^0$ fluorescence spectrum overlaps with the $NV^-$ spectrum. Thus, generating separation between these overlapping spectrums by altering the phonon mediated spectrum allows a filter to be used with the magnetometer device and/or with the data output from the magnetometer device to filter out the unwanted spectrum of $NV^0$ photon emissions while reducing the amount of $NV^-$ photon emissions filtered out.

In the context of DNV spectrometry, optical contrast is defined by ratio of $NV^-$ photon emissions to total fluorescence. The total fluorescence is a combination of $NV^0$ photon emissions, $NV^-$ photon emissions, and a ratio of photon emissions transmitted to scattered optical drive, such as transmitted into the diamond of the DNV and/or absorbed by other nitrogen vacancies. The optical drive is traditionally higher energy and narrowband making it easy to filter out. The majority of fluorescence from $NV^0$ centers and $NV^-$ centers that originates from a phonon sideband is a function of the energy versus momentum (E vs. k). That is, the fluorescence from the $NV^0$ centers and $NV^-$ centers that originates from the phonon sideband is a function of the applied optical drive and the momentum imparted by a phonon assisting the transition of the electron from the conduction band to the valence band. The width and shape of the spectral content of the photon emissions is thus a function of the combination of the phonon spectrum and the E vs. k variation.

At room temperature, the fluorescence of wavelengths of the $NV^0$ photon emissions and the $NV^-$ photon emissions overlap because the phonon spectrum is dominated by temperature. Controlling the phonon spectrum can alter the response fluorescence spectrum, which can allow the spectrum profile of wavelengths of the $NV^0$ photon emissions and the $NV^-$ photon emissions to be narrowed. By narrowing the spectrum profiles, the peaks of the $NV^0$ photon emissions at a particular wavelength and the $NV^-$ photon emissions at another particular wavelength display a more defined difference in fluorescence intensity peaks based on the greater separation of the $NV^0$ and $NV^-$ spectra. The more defined fluorescence intensity peaks can permit a filter, such as a long pass filter, to be used to filter out the unwanted $NV^0$ photon emissions, thereby increasing the optical contrast for the remaining $NV^-$ photon emissions.

The $NV^0$ and $NV^-$ spectra can be manipulated through acoustic driving and diamond shape optimization that affects the phonon spectrum experienced by the $NV^0$ centers and $NV^-$ centers. For instance, acoustic driving can increase and/or control the phonon spectrum by generating phonons within the lattice structure of the diamond at a specific frequency or at a set of specific frequencies. The generation of phonons at a specific frequency can narrow the phonons experienced by the NV centers within the diamond such that the effects of other phonons, e.g., lattice vibrations, such as those introduced based upon the temperature of the material, may be reduced. The narrowing of phonons experienced by the NV centers can result in sharper wavelength intensity peaks for the $NV^0$ photon emissions and the $NV^-$ photon emissions. Thus, by acoustically driving the diamond at a particular frequency, the bandwidth of the $NV^0$ and $NV^-$ spectra can be narrowed to permit optical filtering. In some implementations, the shape of the diamond can be modified to enhance the phonon spectrum by modifying the resonance of the diamond. The resonance of the diamond can also narrow the phonons experienced by the $NV^0$ and $NV^-$ centers. In some further implementations, the optical drive applied to the diamond of the DNV sensor may be matched with a $NV^0$ zero phonon line to decrease the phonon sideband.

FIG. 1 is a graphical diagram 100 depicting an example of a DNV optical fluorescence spectrum from $NV^0$ centers and $NV^-$ centers. For a DNV based optically detected magnetic resonance (ODMR) sensor, the meaningful signal is a change in fluorescence of the $NV^-$ states, indicating a resonant energy level. The inactive $NV^0$ fluorescence spectrum 120, however, overlaps the desired signal of the $NV^-$ fluorescence spectrum 110. Thus, for a large portion of the $NV^-$ fluorescence spectrum 110, the $NV^0$ fluorescence spectrum 120 causes a large background signal that is subject to noise and that ultimately raises the noise floor and reduces magnetic field detection sensitivity. The majority of the spectral content of the NV fluorescence spectrum is the result of the phonon mediated transitions. In some materials, such as indirect bandgap materials, exciton recombination requires absorption of a phonon and release of a photon. The released photon is the fluorescence of the NV⁻ fluorescence spectrum 110 and/or NV⁰ fluorescence spectrum 120 shown in FIG. 1. In room temperature diamonds, there is a Boltzmann distribution of phonon energies dictated by the temperature and variations in vibrations experienced in the lattice structure of the diamond, resulting in a broad phonon spectrum that can be experienced by the NV⁰ and NV⁻ centers of the diamond. Thus, the broad phonon spectrum results in the broad bandwidth of the NV⁻ fluorescence spectrum 110 and NV⁰ fluorescence spectrum 120 as shown in FIG. 1. The NV⁻ fluorescence spectrum 110 and NV⁰ fluorescence spectrum 120 overlap, thus resulting in an increase in the background of the signal and low optical contrast.

Figure 2:
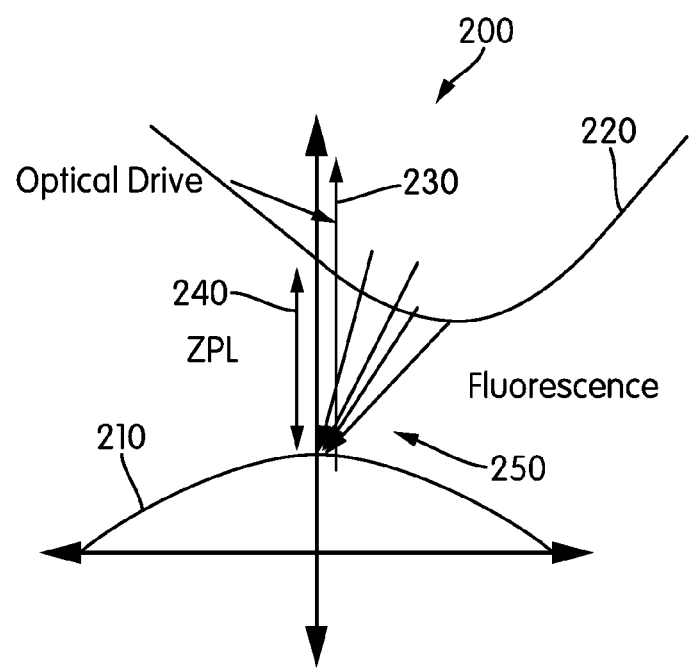
FIG. 2 is a graphical diagram for the indirect band gap for a diamond having nitrogen vacancies depicting a valence band and a conduction band on an energy versus momentum (E vs. k) plot and showing a zero phonon line, an optical drive for exciting an electron over the band gap, and the recombination of the electron from various points of the conduction band to generate photons.

FIG. 2 depicts an energy vs. momentum diagram 200 for the indirect band gap of a diamond of a DNV sensor showing a valence band 210 and a conduction band 220. When an optical drive 230 is applied to and absorbed by an electron in the valence band 210, the excited electron is elevated to the conduction band 220. When the electron returns to the ground state from the conduction band 220 through recombination, a photon is emitted. When electrons in a diamond of a DNV sensor recombine from various points of the conduction band 220, such as due to the phonon sideband, a fluorescence spectrum of photons 250 are emitted as shown in FIG. 1. In some implementations, matching the optical drive frequency 230 with a zero phonon line (ZPL) 240 can decrease the phonon sideband, thereby increasing the optical contrast. However, at low temperatures, such as near 0 Kelvin, the vibrational energy due to temperature is minimal, which results in a minimal phonon sideband. The energy of the resulting photons is $\hbar \omega$, where $\hbar$ is the Plank constant and w is the angular frequency, which is equal to $2\pi f$, where f is the frequency. Thus, when an optical drive 230 is applied along a zero phonon line (ZPL) 240, the fluorescence spectrum would include a single peak at the ZPL frequency when a fluorescence photon 250 is emitted. If vibrational energy is introduced into the diamond at such low temperatures, such as through an acoustic driver, then the added vibrational energy results in phonon energy, $\hbar_{phonon}$, that can be imparted to the electrons in the momentum direction of the diagram 200 for phonon assisted transitioning. The resulting fluorescence photons 250 emitted from the phonon driven electrons results in a second peak for the driven vibrational frequency. The driven vibrational frequency can be adjusted to narrow the phonon spectrum at room temperature, thereby narrowing the fluorescence spectrum for the photons 250 that are emitted from the diamond at room temperature. In some implementations, the shape of the diamond can be modified to manipulate the phonon spectrum by modifying the resonance of the diamond, either separately or in addition to the driven vibrational frequency.

Figure 3:
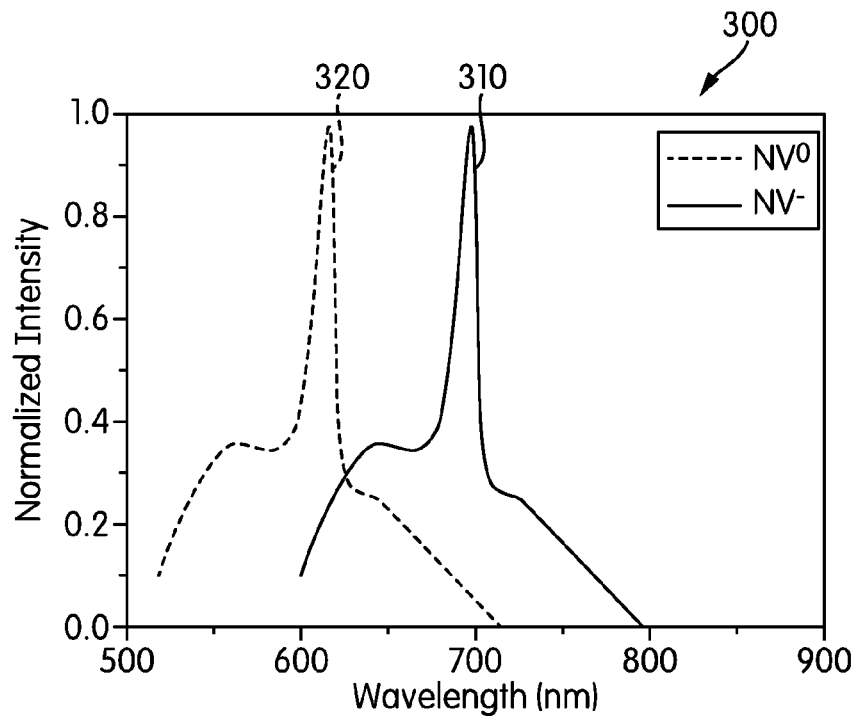
FIG. 3 is a graphical diagram depicting $NV^0$ and $NV^-$ photon intensity relative to wavelength with fluorescence manipulation.

FIG. 3 illustrates is a graphical diagram 300 depicting NV⁰ and NV⁻ photon intensity spectra relative to wavelength with fluorescence manipulation. As shown in FIG. 3, the desired signal of the NV⁻ fluorescence spectrum 310 and the inactive NV⁰ fluorescence spectrum 320 include narrower bandwidths for the peaks at particular frequencies due to controlling the phonon spectrum that alters the response fluorescence spectrum. The phonon spectrum manipulation can be controlled through acoustic driving and/or diamond size and/or shape optimization. The narrow bandwidth peaks allows for greater separation between the NV⁰ and NV⁻ spectra, which enables the use of filtering to increase optical contrast. For instance, a filter, such as a long pass filter, can be used to filter out the unwanted NV⁰ photon emissions while filtering a minimal amount of NV⁻ photon emissions, thereby increasing the optical contrast. The subject technology provides a device that can control the phonon content within the diamond resulting in a controlled spectral content. This allows for better background suppression and overall greater optical contrast. The optical contrast can be directly related to the overall system sensitivity. For instance, with narrower bandwidth peaks for the NV⁻ fluorescence spectrum 310, smaller changes in magnitude of an external magnetic field can be detected. In some instances, controlling the phonon spectrum within the diamond may allow achieving an optical contrast that approaches the theoretical limit or approximately 25%.

Figure 4:
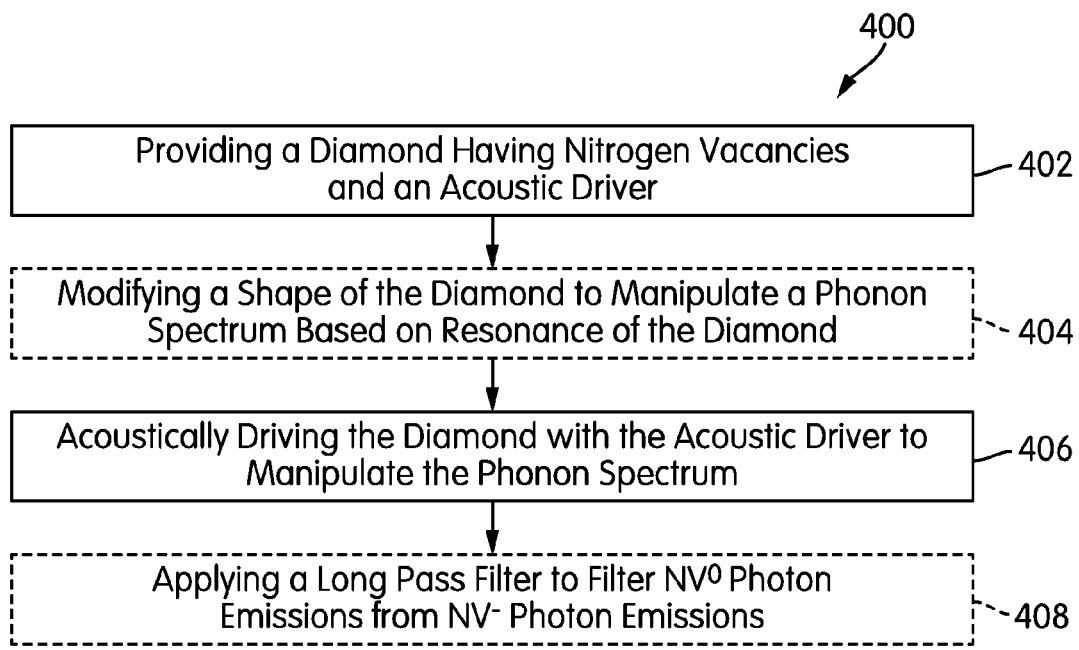
FIG. 4 is a process diagram for fluorescence manipulation of the diamond having nitrogen vacancies through phonon spectrum manipulation using an acoustic driver.

FIG. 4 depicts a method 400 for fluorescence manipulation of a diamond having nitrogen vacancies through phonon spectrum manipulation using an acoustic driver. The method 400 includes providing a diamond having nitrogen vacancies and an acoustic driver (block 402). The diamond having nitrogen vacancies can be part of a DNV sensor that includes a photo detector configured to detect photon emissions from the diamond responsive to laser excitation of the diamond. The acoustic driver may be a piezoelectric acoustic driver or any other acoustic driver for inducing vibrations to the diamond. In some implementations, the acoustic driver may be coupled to the diamond to directly impart vibrational energy to the diamond or may be spaced apart from the diamond to indirectly impart vibrational energy to the diamond. In some implementations, the acoustic driver may be positioned relative to the diamond such that the acoustic driver drives the diamond parallel to the nitrogen vacancies of a lattice of the diamond.

The method 400 may include modifying a shape and/or size of the diamond to manipulate a phonon spectrum based on resonance of the diamond (block 404). The shape of the diamond may be modified to alter the internal resonance of the diamond such that the phonons resulting from the vibrational energy imparted based on the temperature can be narrowed for the phonon spectrum. In some instances, the size of the diamond may also be modified to alter the resonance to manipulate the phonon spectrum.

The method 400 further includes acoustically driving the diamond with the acoustic driver to manipulate the phonon spectrum (block 406). Acoustically driving the diamond may include activating the acoustic driver at a particular frequency to narrow the phonon spectrum. In some implementations, the acoustic driver may be a piezoelectric acoustic driver. In some implementations, the acoustic driver may be positioned relative to the diamond such that the acoustic driver drives the diamond parallel to the nitrogen vacancies of a lattice of the diamond.

The method may include applying a long pass filter to filter NV⁰ photon emissions from NV⁻ photon emissions (block 408). The filter, such as a long pass filter, can be used to filter out the unwanted NV⁰ photon emissions while filtering a minimal amount of NV⁻ photon emissions, thereby increasing the optical contrast. In some implementations, the long pass filter may be incorporated into the photo detector of the DNV sensor and/or may be applied to data output from the photo detector.

Figure 5:
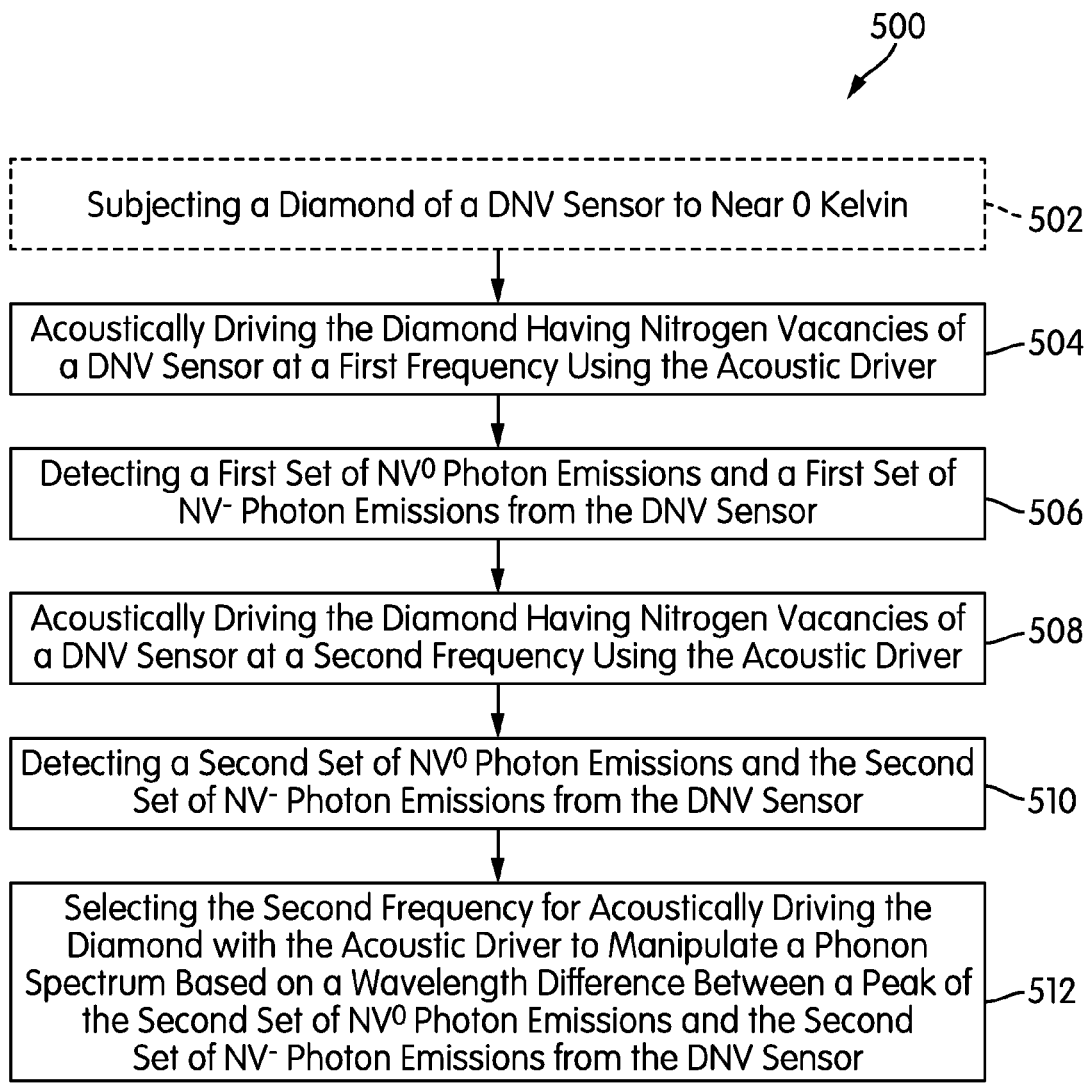
FIG. 5 is a process diagram for determining an acoustic driving frequency for phonon spectrum manipulation.

FIG. 5 depicts a method 500 for determining an acoustic driving frequency for phonon spectrum manipulation for a DNV sensor. The method 500 can include subjecting a diamond of a DNV sensor to near 0 Kelvin (block 502). The diamond of the DNV sensor includes nitrogen vacancies and the DNV sensor may include a photo detector configured to detect photon emissions from the diamond responsive to laser excitation of the diamond. Subjecting the diamond to near 0 Kelvin may include cryogenically cooling the diamond to a near 0 Kelvin temperature.

The method 500 includes acoustically driving the diamond having nitrogen vacancies of the DNV sensor at a first frequency using an acoustic driver (block 504). Acoustically driving the diamond may include activating the acoustic driver at a particular frequency to narrow the phonon spectrum. In some implementations, the acoustic driver may be a piezoelectric acoustic driver. In some implementations, the acoustic driver may be positioned relative to the diamond such that the acoustic driver drives the diamond parallel to the nitrogen vacancies of a lattice of the diamond. The first frequency can be a randomly selected frequency, a frequency within a range of frequencies, and/or a frequency based on a frequency response output.

The method 500 includes detecting a first set of $NV^0$ photon emissions and a first set of $NV^-$ photon emissions from the DNV sensor (block 506). The detection of the first set of $NV^0$ photon emissions and the first set of $NV^-$ photon emissions from the DNV sensor may include receiving and processing data from a photo detector of the DNV sensor. In some implementations, the first set of $NV^0$ photon emissions and the first set of $NV^-$ photon emissions from the DNV sensor may form spectra such as those shown in FIG. 1 or 3.

The method 500 includes acoustically driving the diamond having nitrogen vacancies of the DNV sensor at a second frequency using an acoustic driver (block 508). The second frequency can be a randomly selected frequency, a frequency within a range of frequencies, and/or a frequency based on a frequency response output.

The method 500 includes detecting a second set of $NV^0$ photon emissions and a second set of $NV^-$ photon emissions from the DNV sensor (block 510). The detection of the second set of $NV^0$ photon emissions and the second set of $NV^-$ photon emissions from the DNV sensor may include receiving and processing data from a photo detector of the DNV sensor. In some implementations, the second set of $NV^0$ photon emissions and the second set of $NV^-$ photon emissions from the DNV sensor may form spectra such as those shown in FIG. 1 or 3.

The method 500 includes selecting the second frequency for acoustically driving the diamond with the acoustic driver to manipulate a phonon spectrum based on a wavelength difference between a peak of the second set of $NV^0$ photon emissions and the second set of $NV^-$ photon emissions from the DNV sensor (block 512). The selection of the second frequency may be based on the second frequency producing a fluorescence spectrum similar to FIG. 3 rather than FIG. 1. In some implementations, the method 500 may include applying a long pass filter to filter $NV^0$ photon emissions from $NV^-$ photon emissions detected by the photo detector. In some implementations, the method 500 can include modifying a shape of the diamond to manipulate the phonon spectrum based on resonance of the diamond.

Figure 6:
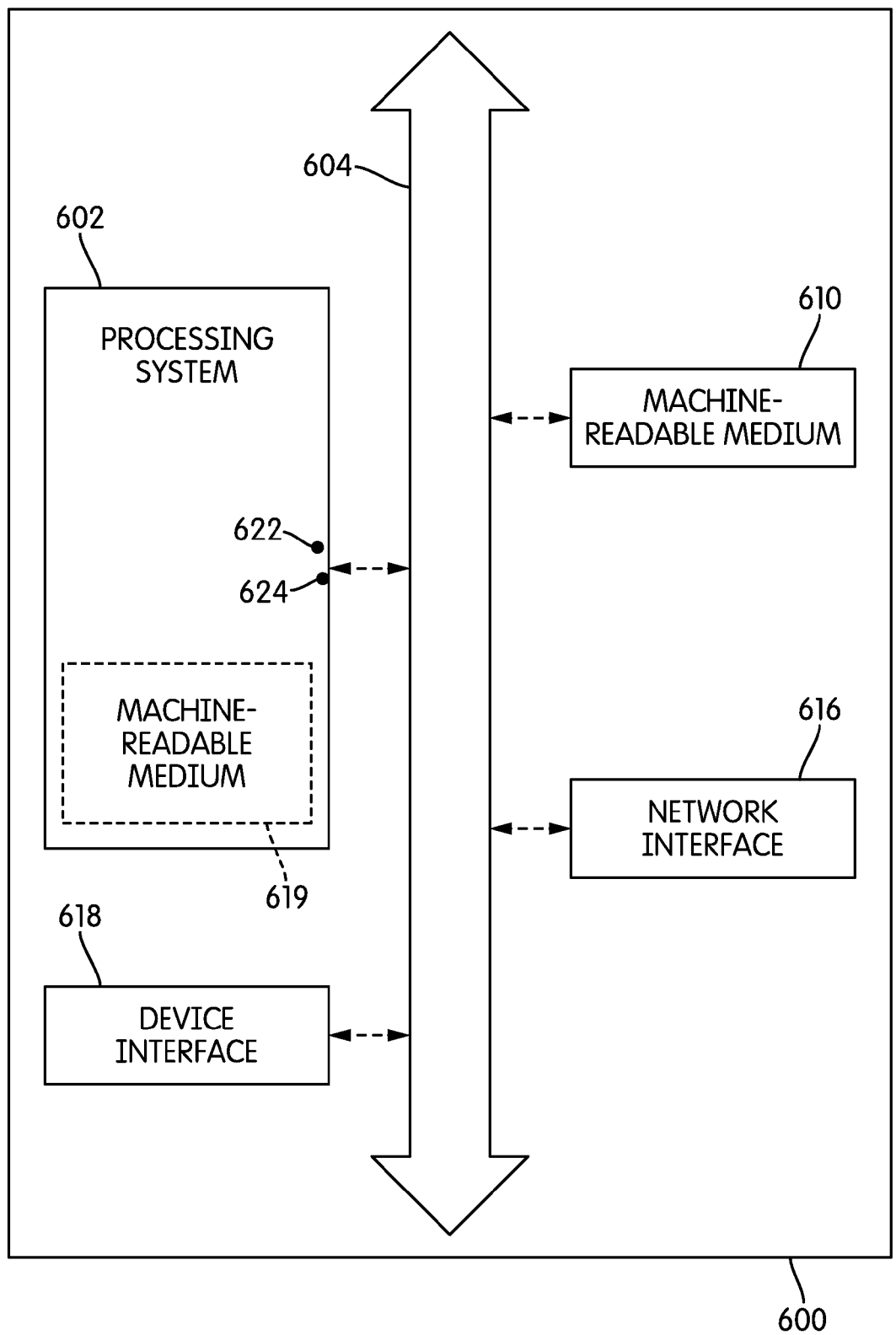
FIG. 6 is a block diagram depicting a general architecture for a computer system that may be employed to interact various elements of the systems and methods described and illustrated herein.

FIG. 6 is a diagram illustrating an example of a system 600 for implementing some aspects of the subject technology. The system 600 includes a processing system 602, which may include one or more processors or one or more processing systems. A processor can be one or more processors. The processing system 602 may include a general-purpose processor or a specific-purpose processor for executing instructions and may further include a machine-readable medium 619, such as a volatile or non-volatile memory, for storing data and/or instructions for software programs. The instructions, which may be stored in a machine-readable medium 610 and/or 619, may be executed by the processing system 602 to control and manage access to the various networks, as well as provide other communication and processing functions. The instructions may also include instructions executed by the processing system 602 for various user interface devices, such as a display 612 and a keypad 614. The processing system 602 may include an input port 622 and an output port 624. Each of the input port 622 and the output port 624 may include one or more ports. The input port 622 and the output port 624 may be the same port (e.g., a bi-directional port) or may be different ports.

The processing system 602 may be implemented using software, hardware, or a combination of both. By way of example, the processing system 602 may be implemented with one or more processors. A processor may be a general-purpose microprocessor, a microcontroller, a Digital Signal Processor (DSP), an Application Specific Integrated Circuit (ASIC), a Field Programmable Gate Array (FPGA), a Programmable Logic Device (PLD), a controller, a state machine, gated logic, discrete hardware components, or any other suitable device that can perform calculations or other manipulations of information.

A machine-readable medium can be one or more machine-readable media. Software shall be construed broadly to mean instructions, data, or any combination thereof, whether referred to as software, firmware, middleware, microcode, hardware description language, or otherwise. Instructions may include code (e.g., in source code format, binary code format, executable code format, or any other suitable format of code).

Machine-readable media (e.g., 619) may include storage integrated into a processing system such as might be the case with an ASIC. Machine-readable media (e.g., 610) may also include storage external to a processing system, such as a Random Access Memory (RAM), a flash memory, a Read Only Memory (ROM), a Programmable Read-Only Memory (PROM), an Erasable PROM (EPROM), registers, a hard disk, a removable disk, a CD-ROM, a DVD, or any other suitable storage device. Those skilled in the art will recognize how best to implement the described functionality for the processing system 602. According to one aspect of the disclosure, a machine-readable medium is a computer-readable medium encoded or stored with instructions and is a computing element, which defines structural and functional interrelationships between the instructions and the rest of the system, which permit the instructions' functionality to be realized. Instructions may be executable, for example, by the processing system 602 or one or more processors. Instructions can be, for example, a computer program including code.

A network interface 616 may be any type of interface to a network (e.g., an Internet network interface), and may reside between any of the components shown in FIG. 6 and coupled to the processor via the bus 604.

A device interface 618 may be any type of interface to a device and may reside between any of the components shown in FIG. 6. A device interface 618 may, for example, be an interface to an external device (e.g., USB device) that plugs into a port (e.g., USB port) of the system 600.

The foregoing description is provided to enable a person skilled in the art to practice the various configurations described herein. While the subject technology has been particularly described with reference to the various figures and configurations, it should be understood that these are for illustration purposes only and should not be taken as limiting the scope of the subject technology.

One or more of the above-described features and applications may be implemented as software processes that are specified as a set of instructions recorded on a computer readable storage medium (alternatively referred to as computer-readable media, machine-readable media, or machine-readable storage media). When these instructions are executed by one or more processing unit(s) (e.g., one or more processors, cores of processors, or other processing units), they cause the processing unit(s) to perform the actions indicated in the instructions. In one or more implementations, the computer readable media does not include carrier waves and electronic signals passing wirelessly or over wired connections, or any other ephemeral signals. For example, the computer readable media may be entirely restricted to tangible, physical objects that store information in a form that is readable by a computer. In one or more implementations, the computer readable media is non-transitory computer readable media, computer readable storage media, or non-transitory computer readable storage media.

In one or more implementations, a computer program product (also known as a program, software, software application, script, or code) can be written in any form of programming language, including compiled or interpreted languages, declarative or procedural languages, and it can be deployed in any form, including as a stand-alone program or as a module, component, subroutine, object, or other unit suitable for use in a computing environment. A computer program may, but need not, correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed to be executed on one computer or on multiple computers that are located at one site or distributed across multiple sites and interconnected by a communication network.

While the above discussion primarily refers to microprocessor or multi-core processors that execute software, one or more implementations are performed by one or more integrated circuits, such as application specific integrated circuits (ASICs) or field programmable gate arrays (FPGAs). In one or more implementations, such integrated circuits execute instructions that are stored on the circuit itself.

In some aspects, the subject technology is related magnetometers, and more particularly to higher magnetic sensitivity magnetometers using fluorescence manipulation by phonon spectrum control. In some aspects, the subject technology may be used in various markets, including for example and without limitation, advanced sensors markets.

The description of the subject technology is provided to enable any person skilled in the art to practice the various embodiments described herein. While the subject technology has been particularly described with reference to the various figures and embodiments, it should be understood that these are for illustration purposes only and should not be taken as limiting the scope of the subject technology.

There may be many other ways to implement the subject technology. Various functions and elements described herein may be partitioned differently from those shown without departing from the scope of the subject technology. Various modifications to these embodiments may be readily apparent to those skilled in the art, and generic principles defined herein may be applied to other embodiments. Thus, many changes and modifications may be made to the subject technology, by one having ordinary skill in the art, without departing from the scope of the subject technology.

A reference to an element in the singular is not intended to mean "one and only one" unless specifically stated, but rather "one or more." The term "some" refers to one or more. Underlined and/or italicized headings and subheadings are used for convenience only, do not limit the subject technology, and are not referred to in connection with the interpretation of the description of the subject technology. All structural and functional equivalents to the elements of the various embodiments described throughout this disclosure that are known or later come to be known to those of ordinary skill in the art are expressly incorporated herein by reference and intended to be encompassed by the subject technology. Moreover, nothing disclosed herein is intended to be dedicated to the public regardless of whether such disclosure is explicitly recited in the above description.

What is claimed is:

1. A method for determining an acoustic driving frequency for a diamond of a diamond nitrogen vacancy (DNV) sensor comprising:
    acoustically driving the diamond having nitrogen vacancies of the DNV sensor at a first frequency using an acoustic driver;
    detecting, by a processing system, a first set of $NV^0$ photon emissions and a first set of $NV^-$ photon emissions from the DNV sensor;
    acoustically driving the diamond of the DNV sensor at a second frequency using the acoustic driver;
    detecting, by the processing system, a second set of $NV^0$ photon emissions and a second set of $NV^-$ photon emissions from the DNV sensor; and
    selecting, by the processing system, the second frequency for acoustically driving the diamond with the acoustic driver to manipulate a phonon spectrum based on a wavelength difference between a peak of the second set of $NV^0$ photon emissions and the second set of $NV^-$ photon emissions from the DNV sensor.

2. The method of claim 1, wherein the acoustic driver acoustically drives the diamond parallel to the nitrogen vacancies of a lattice of the diamond.

3. The method of claim 1, wherein the acoustic driver is a piezoelectric acoustic driver.

4. The method of claim 1 further comprising:
    applying a long pass filter to filter $NV^0$ photon emissions from $NV^-$ photon emissions detected by a photo detector.

5. The method of claim 1 further comprising:
    modifying a shape of the diamond to manipulate the phonon spectrum based on resonance of the diamond.

6. The method of claim 1 further comprising:
    filtering out the set of $NV^0$ photon emissions.

7. The method of claim 6, wherein the filter is incorporated into a photo detector.

8. The method of claim 6, wherein the filter is applied to data output from a photo detector.

9. The method of claim 1 further comprising cryogenically cooling the diamond.

10. The method of claim 1, wherein the first frequency is a randomly selected frequency.

11. The method of claim 1, wherein the first frequency is a frequency within a range of frequencies.

12. The method of claim 1, wherein the first frequency is a frequency based on a frequency response output.

13. The method of claim 1, wherein detecting the first set of $NV^0$ photon emissions and the first set of $NV^-$ photon emissions from the DNV sensor comprises processing data from a photo detector of the DNV sensor.

14. The method of claim 1, wherein the first set of $NV^0$ photon emissions and the first set of $NV^-$ photon emissions from the DNV sensor form a spectrum.

15. The method of claim 1, wherein the second frequency is a randomly selected frequency.

16. The method of claim 1, wherein the second frequency is a frequency within a range of frequencies.

17. The method of claim 1, wherein the second frequency is a frequency based on a frequency response output.

18. The method of claim 1, wherein detecting the second set of $NV^0$ photon emissions and the second set of $NV^-$ photon emissions from the DNV sensor comprises processing data from a photo detector of the DNV sensor.

19. The method of claim 1, wherein the second set of $NV^0$ photon emissions and the second set of $NV^-$ photon emissions from the DNV sensor form a spectrum.

\* \* \* \* \*